US008518813B2

(12) United States Patent
Yamakawa

(10) Patent No.: US 8,518,813 B2
(45) Date of Patent: Aug. 27, 2013

(54) SEMICONDUCTOR DEVICE AND METHOD OF MANUFACTURING SEMICONDUCTOR DEVICE

(75) Inventor: Shinya Yamakawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/084,194

(22) Filed: Apr. 11, 2011

(65) Prior Publication Data

US 2011/0189845 A1    Aug. 4, 2011

Related U.S. Application Data

(62) Division of application No. 12/282,112, filed as application No. PCT/JP2008/050007 on Jan. 4, 2008.

(30) Foreign Application Priority Data

Jan. 9, 2007   (JP) .................................. 2007-000978
Dec. 21, 2007  (JP) .................................. 2007-329564

(51) Int. Cl.
 H01L 21/3205  (2006.01)
 H01L 21/4763  (2006.01)
(52) U.S. Cl.
 USPC .................... 438/589; 438/259; 257/E21.159
(58) Field of Classification Search
 USPC ................. 438/589, 259, 270; 257/E21.159, 257/190, 369
 See application file for complete search history.

(56) References Cited

U.S. PATENT DOCUMENTS

| | | | |
|---|---|---|---|
| 6,586,288 B2 * | 7/2003 | Kim et al. ..................... | 438/183 |
| 2004/0129959 A1 * | 7/2004 | Kim et al. ..................... | 257/288 |
| 2007/0108514 A1 * | 5/2007 | Inoue et al. .................... | 257/330 |

FOREIGN PATENT DOCUMENTS

| | | |
|---|---|---|
| JP | 2000-315789 | 11/2000 |
| JP | 2003-258121 | 9/2003 |
| JP | 2004-031753 | 1/2004 |
| JP | 2004-266267 | 9/2004 |
| JP | 2004-097943 | 11/2004 |
| JP | 2005-026707 | 1/2005 |
| JP | 2006-186240 | 7/2006 |
| JP | 2006-261283 | 9/2006 |
| JP | 2006-270051 | 10/2006 |
| JP | 2007-103654 | 4/2007 |
| WO | 2004097943 A1 | 11/2004 |

OTHER PUBLICATIONS

T. Ghani et al.; A 90nm High Volume Manufacturing Logic Technology Featuring Novel 45nm Gate Length Strained Silicon CMOS Transistors; IEDM 2003 Technical Diges; pp. 987.
J. Wang et al.; Novel Channel-Stress Enhancement Technology with eSiGe S/D and REcessed Channel on Damascene Gate Process; 2007 Symposium on VLSI Technology Digest of Technical Papers.
Y. Tateshita et al.; High-Performance and Low-Power CMOS Device Technologies Featuring Metal/High-k Gate STacks with Uniaxial Strained Silicon Channels on (100) and (110) Substrates; International Electron Devices Meeting; 2006; IEDM 06.
Japanese Office Action issued in connection with related JP Application No. 2007-329564 dated Mar. 19, 2013.

* cited by examiner

Primary Examiner — Chuong A Luu
Assistant Examiner — Nga Doan
(74) Attorney, Agent, or Firm — Dentons US LLP

(57) ABSTRACT

A method of manufacturing a semiconductor device in which a stress can be effectively applied from a semiconductor layer having a different lattice constant from a semiconductor substrate to a channel part, whereby carrier mobility can be improved and higher functionality can be achieved.

2 Claims, 23 Drawing Sheets

FIG. 6
(1)
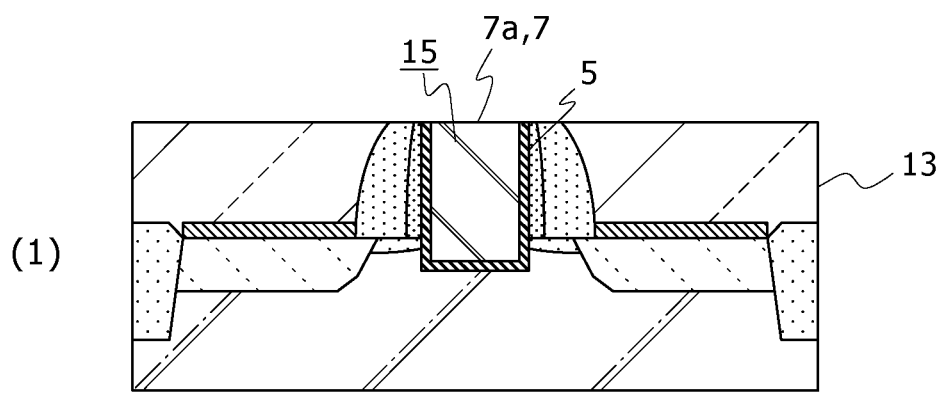
(2)
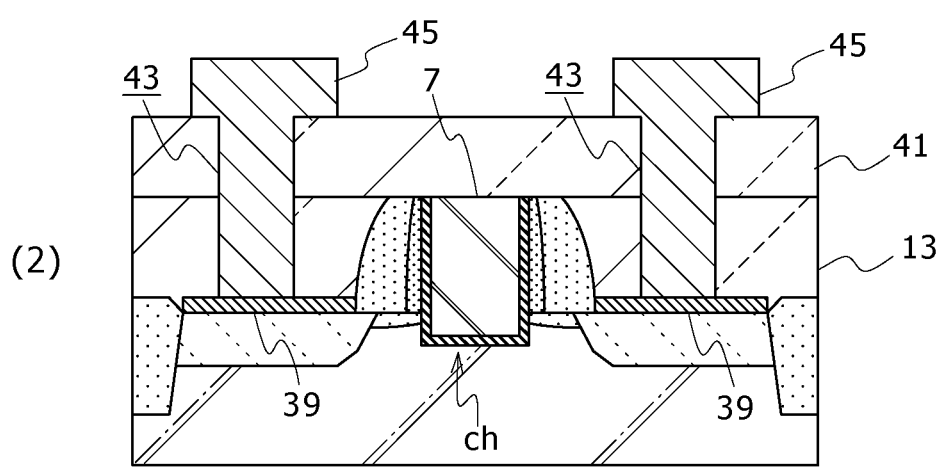

FIG. 19
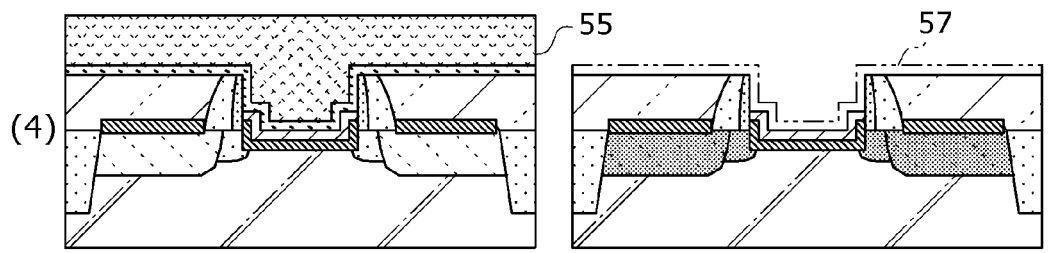
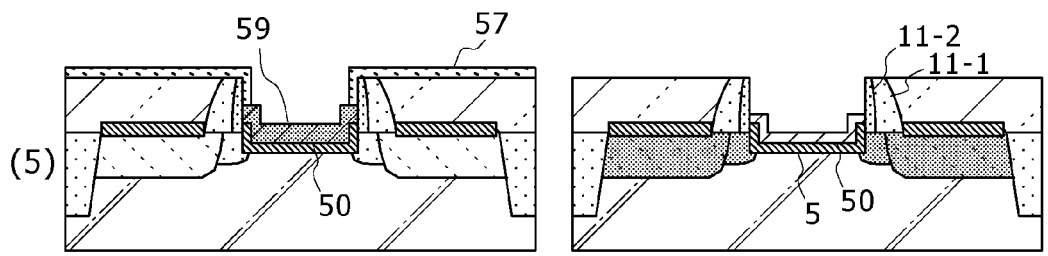
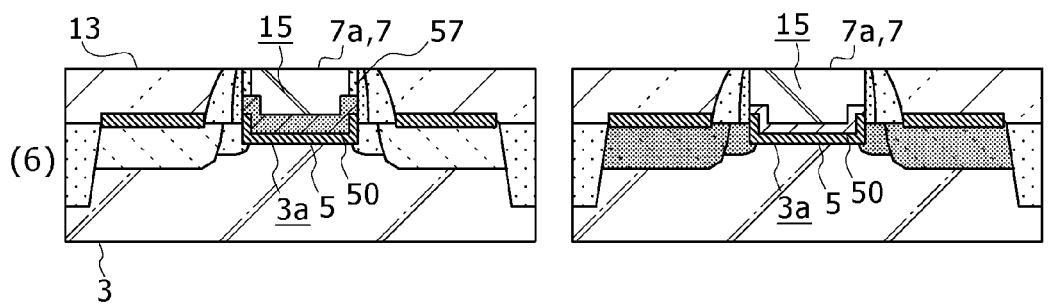

FIG. 20
Prior Art
(1)
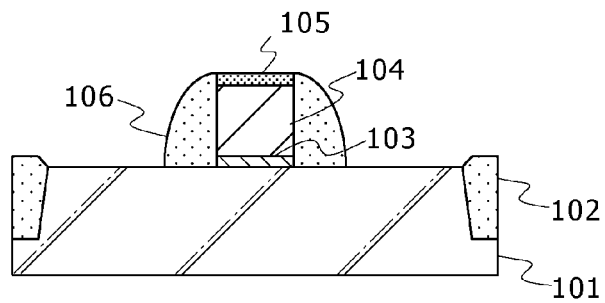
(2)
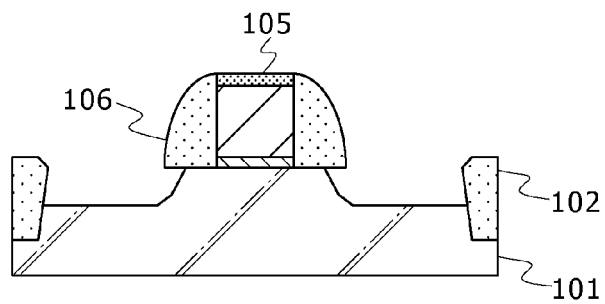
(3)
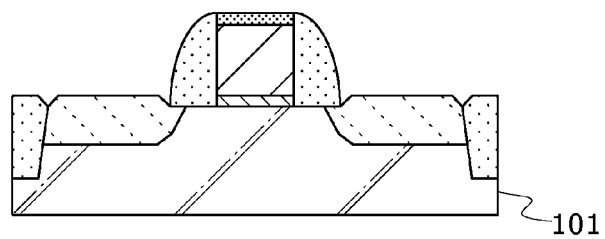
(4)
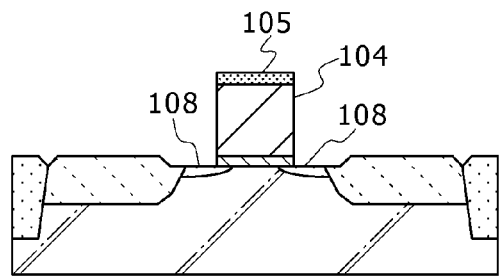
(5)
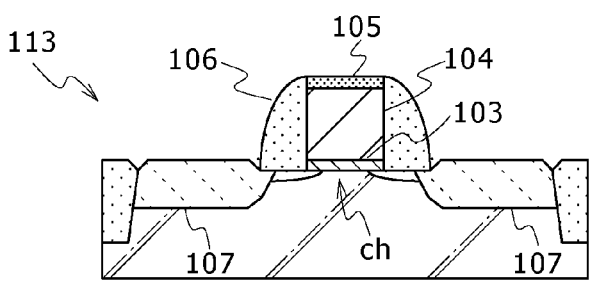

FIG.21
Prior Art
(1)
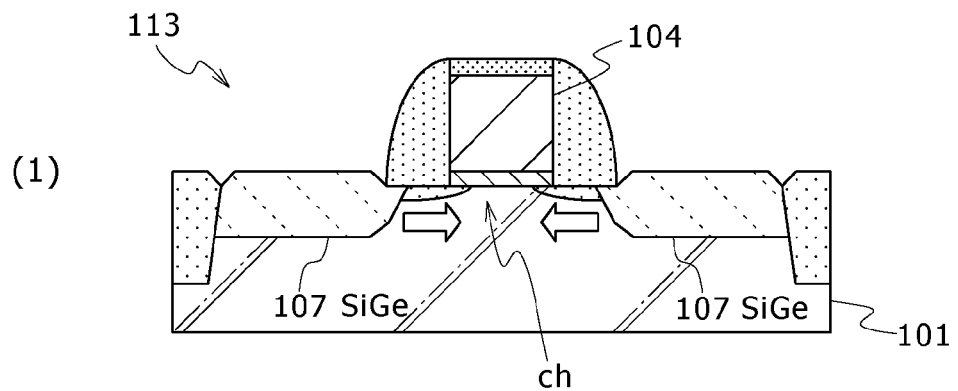
(2)
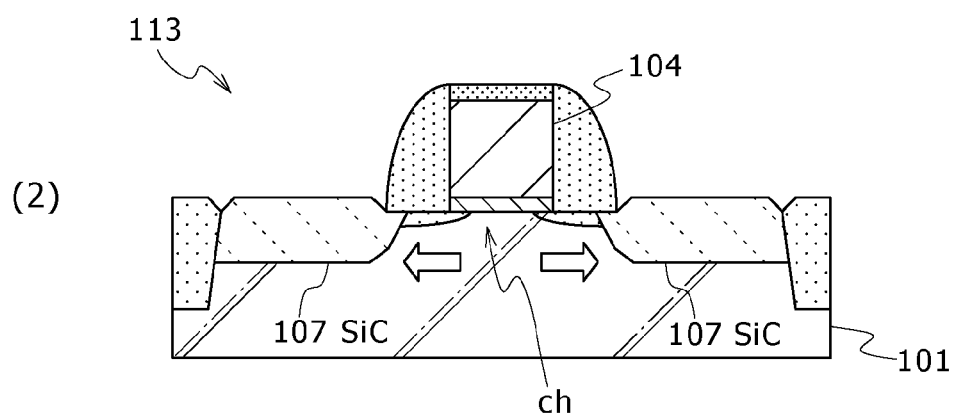

SEMICONDUCTOR DEVICE AND METHOD OF MANUFACTURING SEMICONDUCTOR DEVICE

RELATED APPLICATION DATA

This application is a division of U.S. patent application Ser. No. 12/282,112, filed Sep. 8, 2008, the entirety of which is incorporated herein by reference to the extent permitted by law. U.S. patent application Ser. No. 12/282,112 is the Section 371 National Stage of PCT/JP2008/050007. This application claims the benefit of priority to Japanese Patent Application Nos. 2007-000978, filed Jan. 9, 2007 and 2007-329564, filed Dec. 21, 2007.

The present invention relates to a semiconductor device and a manufacturing method thereof, and especially has an object of providing a semiconductor device and a manufacturing method thereof to which a technique of improving carrier mobility by applying a stress to a channel part in a semiconductor substrate in a semiconductor device of a field-effect transistor structure is applied.

The miniaturization of an integrated circuit using a field-effect transistor has various advantages of increasing speed and reducing power consumption, price, and size, for example, and has therefore advanced unceasingly. Today, it is possible to form a transistor having a gate length less than 100 nm. Further, a gate length of 20 nm or less is predicted in a transistor referred to as a 32 nm node on an ITRS (International Technology Roadmap for Semiconductors) roadmap.

In addition, not only the reduction of the gate length but also a scaling down (scaling) of a device structure itself has been underway. However, when the gate length is in a range from a submicron region to a region less than 100 nm, a physical film thickness of a silicon oxide ($SiO_2$) base insulating film used conventionally as a gate insulating film is reaching a limit from a viewpoint of suppression of a gate leakage current.

In view of this, a method of increasing the dielectric constant of the gate insulating film by using a hafnium oxide base high dielectric constant (High-K) insulating film as the gate insulating film, a method of suppressing the depletion of a gate electrode by using a metallic material, and the like are considered as methods for decreasing the effective film thickness of the gate insulating film.

In the method of suppressing the depletion of the gate electrode among these methods, using tungsten (W), titanium (Ti), hafnium (Hf), ruthenium (Ru), iridium (Ir) or the like as a metallic material for the gate electrode is considered. However, these metallic materials react with the gate insulating film or the like when subjected to heat treatment at a high temperature, causing problems of degradation of the gate insulating film and changes in threshold voltage of the transistor. Thus, a conventional process that forms an impurity diffused layer such as a source region and a drain region after forming a gate electrode causes the above-described problems in a heat treatment for impurity activation.

In order to solve the problems of the gate electrode formed of such metallic materials, a damascene gate process has been proposed which forms a gate electrode after forming the source region and the drain region (see Japanese Patent Application Laid-Open No. 2000-315789 and Japanese Patent Application Laid-Open No. 2005-26707). In the damascene gate process which is a method that a source region and a drain region are formed first in a state of a dummy gate being formed. Thereafter, an interlayer insulating film covering the dummy gate is formed and then polished this to expose the dummy gate, the dummy gate is removed by etching, and a new gate insulating film and a new gate electrode are formed in a part where the dummy gate is removed. This method can prevent an effect of heat treatment for impurity activation in the formation of the source region and the drain region from being produced on the gate electrode.

On the other hand, a method of increasing the carrier mobility of a channel part in a silicon substrate by applying a stress to the channel part is actively used. As one of such techniques, a technique has been proposed which applies a stress to a channel part by forming a semiconductor layer of silicon germanium (SiGe) or silicon carbide (SiC) having a lattice constant different from that of silicon (Si) as a source/drain (S/D) by epitaxial growth (see for example Japanese Patent Application Laid-Open No. 2006-186240 and "IEDM 2003 Technical Digest", T. Ghani et al., "A 90 nm High Volume Manufacturing Logic Technology Featuring Novel 45 nm Gate Length Strained Silicon CMOS Transistors", (US), 2003, p. 987).

In this case, first, as shown in (1) of FIG. 20, after device isolation regions 102 are formed on the surface side of a silicon substrate 101, a gate electrode 104 is formed via a gate insulating film 103. A stopper layer 105 is formed on the gate electrode 104. In addition, insulative side walls 106 are formed on the side walls of the gate insulating film 103, the gate electrode 104, and the stopper layer 105. Next, as shown in (2) of FIG. 20, the surface layer of the silicon substrate 101 is dug down with the stopper layer 105 and the side walls 106 as a mask. Next, as shown in (3) of FIG. 20, semiconductor layers 107 having a different lattice constant from that of Si are epitaxially grown on the exposed surface of the dug-down silicon substrate 101. The side walls 106 are removed after the formation of the semiconductor layers 107. Next, as shown in (4) of FIG. 20, ion implantation for forming extensions 108 of a source region and a drain region is performed with the stopper layer 105 as a mask. Next, as shown in (5) of FIG. 20, side walls 109 are formed again, and with the stopper layer 105 and the side walls 109 as a mask, ion implantation for forming the source/drain region in the semiconductor layers 107 is performed. Then, heat treatment for impurity activation introduced by the ion implantation is performed.

In a semiconductor device 113 thus fabricated, a stress from the semiconductor layers 107 is applied to a channel part ch under the gate electrode. At this time, as shown in (a) of FIG. 21, when the semiconductor device 113 is a p-channel type MOS transistor, SiGe having a larger lattice constant than Si is epitaxially grown as the semiconductor layers 107. Thereby, a compressive stress is applied to the channel part ch, so that the mobility of carriers (positive holes) can be improved. On the other hand, as shown in (b) of FIG. 21, when the semiconductor device 113 is an n-channel type MOS transistor, SiC having a smaller lattice constant than Si is epitaxially grown as the semiconductor layers 107. Thereby, a tensile stress is applied to the channel part ch, so that the mobility of carriers (electrons) can be improved.

However, in the technique of applying the stress to the channel part ch as described with reference to FIG. 20 and FIG. 21, the stress applied from the semiconductor layers 107 to the channel part ch is weakened by reaction from the gate electrode 104 disposed above the channel part. Therefore, the stress from the semiconductor layers 107 is not effectively applied to the channel part ch, so that improvement in carrier mobility is hindered.

In addition, in such a technique, the higher the concentration of Ge or the concentration of C in the semiconductor layers 107, the greater the effect of improving carrier mobility. However, when the concentration of Ge or the concentration of C is too high, a defect occurs at an interface between the silicon substrate 101 and the semiconductor layers 107, thereby causing problems of a decrease in stress and an increase in junction leakage.

It is accordingly an object of the present invention to provide a semiconductor device and a manufacturing method thereof in which a stress can be effectively applied from a semiconductor layer having a different lattice constant from that of a substrate to a channel part, whereby carrier mobility can be improved and higher functionality can be achieved.

DISCLOSURE OF INVENTION

A semiconductor device according to the present invention for achieving the above object includes: a gate electrode disposed on a semiconductor substrate via a gate insulating film; and stress applying layers for applying a stress to a channel part under the gate electrode. The stress applying layers are disposed at a position deeper than a surface of the semiconductor substrate on both sides of the gate electrode. In addition, the gate insulating film and the gate electrode are disposed in a state of filling a part formed by digging down the surface of the semiconductor substrate between the stress applying layers.

In the semiconductor device having such a constitution, the gate insulating film and the gate electrode formed so as to fill the part formed by digging down the surface of the semiconductor substrate are provided, and therefore the channel part is at the position deeper than the surface of the semiconductor substrate. Thereby the stress applied to a part of the semiconductor substrate between the stress applying layers over the depth direction of the stress applying layers disposed at the position deeper than the surface of the semiconductor substrate on both sides of the gate electrode is intensively applied to the channel part. Thus, as compared with the conventional constitution having the channel part formed at substantially the same height as that of the surface of the semiconductor substrate, the stress from the stress applying layers can be applied to the channel part more effectively.

In addition, a method of manufacturing a semiconductor device according to the present invention for achieving the above object is characterized by being performed by the following procedure. First, in a first step, a dummy gate electrode is formed on a semiconductor substrate, and a surface of the semiconductor substrate is dug down by etching with the dummy gate electrode as a mask. In a next second step, stress applying layers of a semiconductor material having a different lattice constant from the semiconductor substrate are formed by epitaxial growth on the dug-down surface of the semiconductor substrate. Then, in a third step, an interlayer insulating film is formed in a state of covering the dummy gate electrode and the stress applying layers, the dummy gate electrode is made to be exposed from the interlayer insulating film, and then the dummy gate electrode is removed. Thereby, a groove pattern is formed in the interlayer insulating film, and the semiconductor substrate is exposed. Next, in a fourth step, an exposed surface of the semiconductor substrate exposed at a bottom part of the groove pattern is dug down. Thereafter, in a fifth step, a new gate electrode is filled and formed via a gate insulating film within the groove pattern in which the exposed surface of the semiconductor substrate is dug down.

According to such a procedure, by removing the dummy gate electrode with the stress applying layers formed in the third step, a stress applied from the stress applying layers to a part of the semiconductor substrate under the dummy gate electrode is prevented from being weakened by reaction from the dummy gate electrode. Thereby, the stress from the stress applying layers is effectively applied to the part of the substrate between the stress applying layers. Then, in particular, by further digging down the semiconductor substrate under the dummy gate electrode in the next fourth step, the channel part is at a position deeper than the surface of the substrate between the stress applying layers, between which the stress is applied effectively, in a state of the gate insulating film and the gate electrode being made in the fifth step. Thereby the stress applied to the part of the semiconductor substrate between the stress applying layers over the depth direction of the stress applying layers is intensively applied to the channel part. It is therefore possible to apply the stress from the stress applying layers to the channel part effectively and intensively.

In addition, another example of a method of manufacturing a semiconductor device according to the present invention for achieving the above object is characterized by being performed by the following procedure. First, in a first step, a recess part is formed by digging down a surface side of a semiconductor substrate. In a next second step, a dummy gate electrode is formed so as to overlap the recess part, and a surface of the semiconductor substrate is dug down by etching with the gate electrode as a mask. Then, in a third step, stress applying layers made of a semiconductor material having a different lattice constant from the semiconductor substrate are formed by epitaxial growth on the dug-down surface of the semiconductor substrate. Next, in a fourth step, an interlayer insulating film is formed in a state of covering the dummy gate electrode and the stress applying layers, the dummy gate electrode is made to be exposed from the interlayer insulating film, and then the dummy gate electrode is removed, whereby a groove pattern overlapping the recess part of the semiconductor substrate is formed. Thereafter, in a fifth step, a new gate electrode is filled and formed via a gate insulating film within the groove pattern including the recess part of the semiconductor substrate.

According to such a procedure, by removing the dummy gate electrode with a state of the stress applying layers formed in the fourth step, a stress applied from the stress applying layers to a part of the semiconductor substrate under the dummy gate electrode is prevented from being weakened by reaction from the dummy gate electrode. Thereby, the stress from the stress applying layers is effectively applied to the part of the substrate between the stress applying layers. Then, in the next fifth step, a new gate electrode is formed via a gate insulating film within the groove pattern including the recess part of the semiconductor substrate. Thereby, the channel part is in a part to which the stress is applied effectively, that is, a position deeper than the surface of the substrate between the stress applying layers. Thereby the stress applied to the part of the semiconductor substrate between the stress applying layers over the depth direction of the stress applying layers is intensively applied to the channel part. It is therefore possible to apply the stress from the stress applying layers to the channel part effectively and intensively.

As described above, according to the present invention, the stress can be applied from the stress applying layers formed by epitaxial growth on both sides of the gate electrode to the channel part more effectively. It is therefore possible to improve carrier mobility without depending on the concentration of a material forming the stress applying layers. As a result, the functionality of the semiconductor device can be enhanced.

BRIEF DESCRIPTION OF DRAWINGS

FIG. 6 is a sectional process view (5) of the first example of the manufacturing method according to the embodiment.

FIG. 20 is a sectional process view explaining a conventional technique.

FIG. 21 is a diagram explaining the application of a stress to a channel part by semiconductor layers.

BEST MODE FOR CARRYING OUT THE INVENTION

Embodiments of the present invention will hereinafter be described in detail with reference to the drawings.
<Semiconductor Device>

Figure 1:
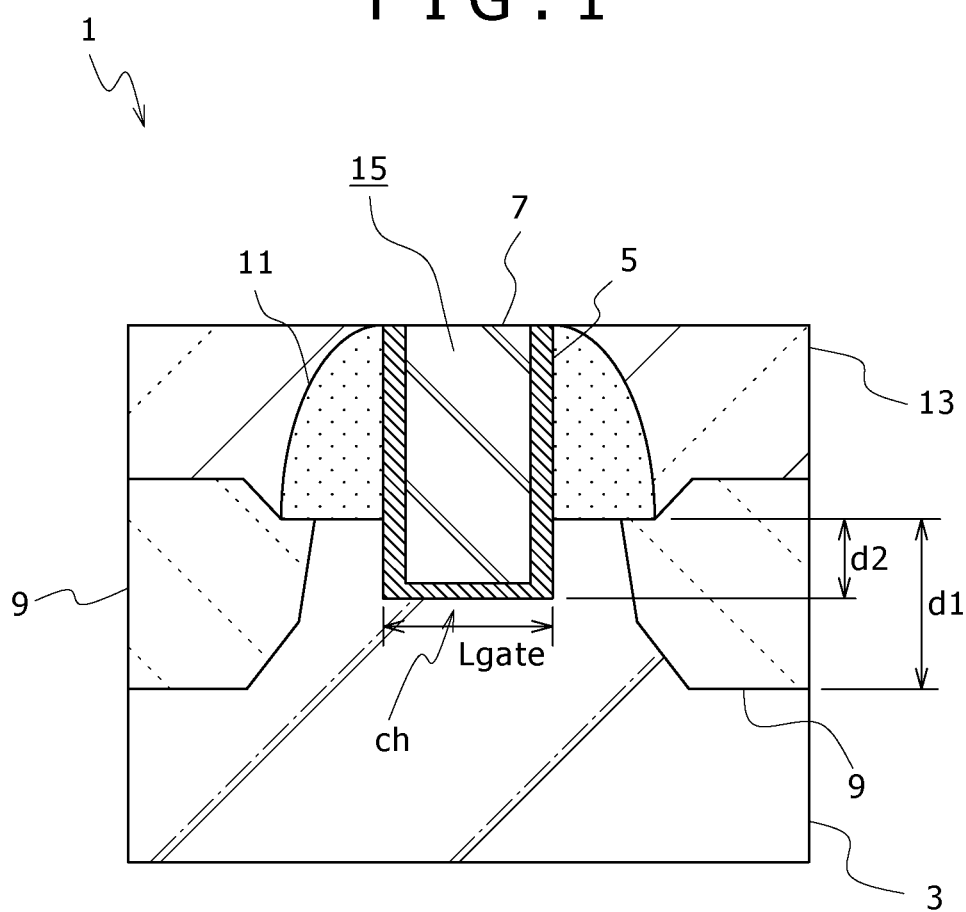
FIG. 1 is a sectional view of a semiconductor device according to an embodiment.

FIG. 1 is a sectional view of principal parts of a semiconductor device 1 to which the present invention is applied. The semiconductor device shown in this figure is a semiconductor device of a field-effect transistor configuration, and is formed as follows.

Namly a gate electrode 7 is formed on a semiconductor substrate 3 made of single-crystal silicon via a gate insulating film 5. A semiconductor layer 9 is provided as a stress applying layer for applying a stress to a channel part ch in the semiconductor substrate 3 under the gate electrode 7 in recess parts formed by digging down the surface of the semiconductor substrate 3 on both sides of the gate electrode 7. It is supposed that, as will be described later in detail in a next manufacturing method, this semiconductor layer 9 is a layer formed by epitaxially growing a semiconductor material having a different lattice constant from that of the semiconductor substrate 3 in the recess parts of the semiconductor substrate 3.

As a particularly characteristic constitution of the present invention, the gate insulating film 5 and the gate electrode 7 are provided in a state of filling a recess part formed by digging down the surface of the semiconductor substrate 3 between the semiconductor layers 9. Thereby the channel part ch provided on a side of an interface with the gate insulating film 5 in the semiconductor substrate 3 is set at a part deeper than the surface of the semiconductor substrate 3 between the semiconductor layers 9.

A part of the semiconductor substrate 3 is preferably left between the gate insulating film 5 and the gate electrode 7 and the semiconductor layers 9.

The gate insulating film 5 and the gate electrode 7 for example have a damascene gate structure, and have insulative side walls 11. In this structure, a groove pattern 15 whose side walls are defined by the side walls 11 is provided in an interlayer insulating film 13 covering the semiconductor substrate 3 and the semiconductor layers 9, for example. The bottom surface of the groove pattern 15 is set at a position to which a part of the semiconductor substrate 3 is further dug down. The gate insulating film 5 is provided in a state of covering the inner walls of the groove pattern 15, and the gate electrode 7 is provided in a state of filling the inside of the groove pattern 15 via the gate insulating film 5.

Suppose in this case that the depth of the recess parts in which the semiconductor layers 9 are disposed with respect to the surface of the semiconductor substrate 3 is a depth d1 of the semiconductor layers 9. In addition, it is supposed that the depth of the recess part in which the damascene gate structure is disposed, that is, the depth position of the gate insulating film 5 with respect to the surface of the semiconductor substrate 3 is a channel depth d2. In this case, [Channel Depth d2]<[Depth d1 of Semiconductor Layers 9]. Incidentally, it is supposed that the optimum depth of the channel depth d2 in this range is determined empirically so as to maximize the stress applied to the channel part ch, as will be described later in detail.

Incidentally, the gate insulating film 5 is not limited to the structure covering the whole of the inner walls of the groove pattern 15 including the bottom surface of the groove pattern 15 as shown in the figure. It suffices for the gate insulating film 5 to be disposed in a state of covering the exposed surface of the semiconductor substrate 3 at least. Thus, as will be described in detail in the later manufacturing method, the gate insulating film 5 may be disposed in a state of exposing an upper part of the inner walls of the groove pattern 15.

In addition, it is desirable that the gate insulating film 5 be formed by a high dielectric constant (High-K) insulating film in order to reduce effective film thickness while maintaining physical film thickness. In this case, a constitution in which the gate insulating film 5 is disposed in a state of exposing an upper part of the inner walls of the groove pattern 15 as described above can suppress a parasitic capacitance occurring between the gate electrode 7r and another electrode due to the gate insulating film 5.

A film made of an oxide, an oxide silicide, a nitride oxide, or an oxide nitride silicide including at least one kind selected from aluminum (Al), yttrium (Y), zirconium (Zr), lanthanum (La), hafnium (Hf), and tantalum (Ta) is used as the dielectric constant insulating film forming the gate insulating film 5. Specifically, $HfO_2$, $ZrO_2$, $La_2O_3$, $Y_2O_3$, $Ta_2O_5$, $Al_2O_3$, HfSiOx, ZrSiOx, ZrTiOx, HfAlOx, ZrAlOx, and nitrides thereof (HfSiON and the like) are further illustrated. Though the relative dielectric constant of these materials somewhat varies depending on composition and crystallinity, for example the relative dielectric constant of $HfO_2$ is 25 to 30 and the relative dielectric constant of $ZrO_2$ is 20 to 25. Incidentally, the gate insulating film 5 may be a laminated structure of a silicon oxide film and a high dielectric constant (High-K) insulating film.

A metal such as Ti, Ru, Hf, Ir, Co, W, Mo, La, Ni, Cu, Al, a Si compound or a N compound of these metals, further, a combination thereof is used as a main metallic layer forming the gate electrode 7. In a case of a laminated structure, a plurality of metallic layers may be laminated to adjust the work function of the gate electrode (to adjust a threshold voltage) or lower the resistance of the gate electrode.

In this case, generally, in a case of an n-type field-effect transistor, the work function of the gate electrode 7 is 4.6 eV or lower, and is desirably 4.3 eV or lower. In a case of a p-type field-effect transistor, on the other hand, the work function of the gate electrode 7 is 4.6 eV or higher, and is desirably 4.9 eV. Then, a difference in the work function of the gate electrode 7 between the n-type and the p-type is desirably 0.3 eV or more.

Accordingly, when the gate electrode 7 is made to be a laminated structure and a lower layer part thereof is made to be a work function controlling layer, a material exhibiting an appropriate work function is selected from among metals formed of the group consisting of Ti, V, Ni, Zr, Nb, Mo, Ru, Hf, Ta, W, Pt and the like or alloys including these metals, and is used as a material forming the work function controlling layer. In addition, compounds of these metals, for example metal nitride, and metal silicide as a compound of a metal and a semiconductor material are used.

Specifically, metals formed of the group consisting of Hf, Ta and the like, alloys including the metals, or the compounds are desirable for the gate electrode 7 of the n-type field-effect transistor, and HfSix is more desirable. The work function of HfSi, which differs depending on composition and crystallinity, is about 4.1 to 4.3 eV.

In addition, metals formed of the group consisting of Ti, Mo, Ru and the like, alloys including the metals, or compounds of the metals are desirable for the gate electrode 7 of the p-type field-effect transistor, and TiN and Ru are more desirable. The work function of TiN, which differs depending on composition and crystallinity, is about 4.5 to 5.0 eV.

In the semiconductor device 1 having the constitution as described above, the channel part ch provided on the side of the interface with the gate insulating film 5 in the semiconductor substrate 3 is set at the part deeper than the surface of the semiconductor substrate 3 between the semiconductor layers 9.

Thereby the stress applied to the part of the semiconductor substrate 3 between the semiconductor layers 9 over the depth direction of the semiconductor layers 9 is intensively applied to the channel part ch situated at an intermediate part in the depth direction of the semiconductor layers 9. Thus, as compared with the conventional constitution in which the channel part is formed at substantially the same height as that of the surface of the semiconductor substrate 3, the stress from the semiconductor layers 9 can be applied to the channel part ch more effectively.

As a result, carrier mobility can be improved irrespective of the concentration of a material forming the semiconductor layers 9. It is therefore possible to achieve higher functionality of the semiconductor device 1. In addition, when a same ON current value is to be obtained, the concentration of Ge or C as a stress applying source can be lowered. It is thus possible to suppress a crystal defect and the occurrence of a leakage current resulting therefrom.

<Method of Manufacturing Semiconductor Device—1>

FIGS. 2 to 6 are sectional process views of a first example of a semiconductor device manufacturing method to which the present invention is applied, and are an example of a method of manufacturing the semiconductor device having the constitution described with reference to FIG. 1. An embodiment of the manufacturing method will be described in the following with reference to these figures. Incidentally, description will be made with the same constituent elements as described with reference to FIG. 1 being identified by the same reference numerals.

Figure 2:
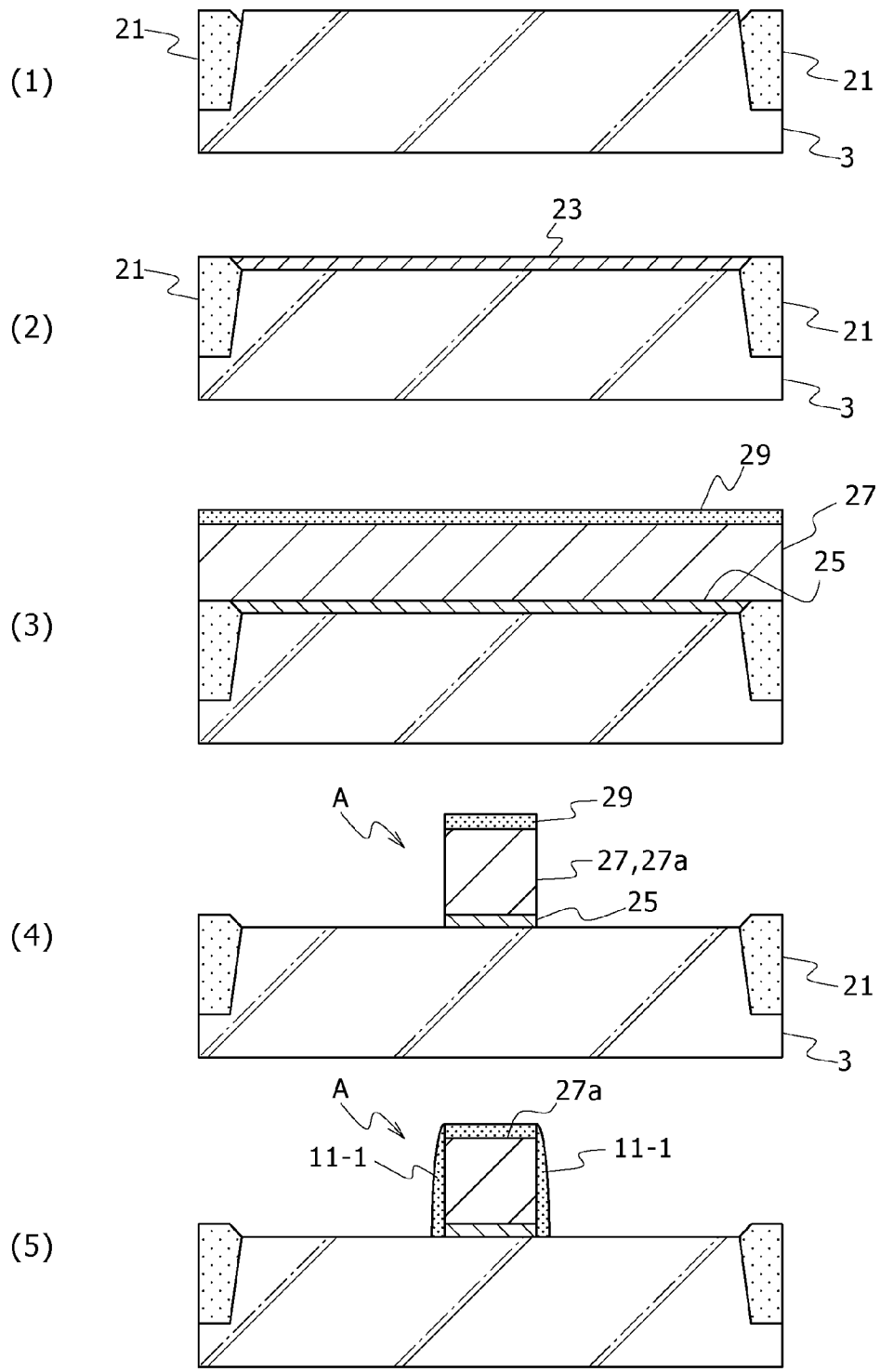
FIG. 2 is a sectional process view (1) of a first example of a manufacturing method according to an embodiment.

First, as shown in (1) of FIG. 2, a device isolation 21 of an STI (Shallow Trench Isolation) structure is formed by filling the inside of grooves with a silicon oxide film on the surface side of a semiconductor substrate 3 formed of single-crystal silicon.

Next, as shown in (2) of FIG. 2, a protective film 23 of a silicon oxide for preventing channeling is formed at a film thickness of about 5 to 10 nm by surface oxidation or the like. Thereafter, an ion implantation of an impurity such as phosphorus (P), arsenic (As), boron (B), indium (In) is performed for threshold adjustment. At this time, the ion implantation of an impurity selected for each of a region for forming an n-channel type field-effect transistor (which region will hereinafter be described as an nMOS region) and a region for forming a p-channel type field-effect transistor (which region will hereinafter be described as a pMOS region) is performed. The protective film 23 is removed after the ion implantation.

Next, as shown in (3) of FIG. 2, a dummy gate insulating film 25 of a silicon oxide is formed at a film thickness of about 1 to 3 nm by a method of thermal oxidation, for example. Thereafter a dummy gate electrode film 27 of polysilicon or amorphous silicon is formed at a film thickness of about 100 to 150 nm by a CVD method. Further, a hard mask layer 29 of a silicon nitride is formed at a film thickness of about 30 to 100 nm on the dummy gate electrode film 27 by a CVD method.

Next, as shown in (4) of FIG. 2, the hard mask layer 29, the dummy gate electrode film 27, and the dummy gate insulating film 25 are pattern-etched into the shape of a gate electrode, whereby a dummy gate structure A is formed.

This pattern etching is performed as follows. First, a resist pattern for the gate electrode is formed on the hard mask layer 29 by using optical lithography technology or electron beam lithography technology. Next, with this resist pattern as a mask, the hard mask layer 29 is etched. Thereby the hard mask layer 29 is patterned. The dummy gate electrode film 27 is then patterned into a dummy gate electrode 27a by etching from over the patterned hard mask layer 29. Further, the dummy gate insulating film 25 is patterned. It is supposed that this patterning is performed by dry etching at a selection ratio such that the hard mask layer 29 is hardly etched. In addition, it is desirable that in the patterning of the dummy gate electrode film 27, etching damage be prevented from causing the surface of the semiconductor substrate 3 on both sides of the dummy gate structure A by performing etching with the dummy gate insulating film 25 as a stopper.

After the above, as shown in (5) of FIG. 2, insulative first side walls 11-1 are formed on the side walls of the dummy gate structure A. In this case, a silicon nitride film having a film thickness of about 1 to 10 nm which film is formed by a CVD method, for example, is etched back by anisotropic etching using a dry etching method. The silicon nitride film is thereby left only on the side walls of the dummy gate structure to form the first side walls 11-1. Incidentally, the first side walls 11-1 may be formed by etching back a silicon oxide film formed by deposition. Further, the first side walls 11-1 may be formed by oxidizing the side walls of the dummy gate electrode 27a.

Incidentally, the first side walls 11-1 are provided for extension position adjustment in formation of extensions of a source region and a drain region which formation is to be performed later. It therefore suffices to provide the first side walls 11-1 as required. Thus, it suffices to perform this process as required.

Next, as shown in (1) of FIG. 3, sacrifice side walls 31 of a silicon oxide to be removed later are formed on the outside of the first side walls 11-1. In this case, the sacrifice side walls 31 are formed by the formation of a silicon oxide film by a CVD method and the subsequent etching back of the silicon oxide film. Incidentally, it is supposed that when a MOS transistor (field-effect transistor) to which the present invention is not applied is formed at the same time on the surface side of the semiconductor substrate 3, the silicon oxide film on this region is left as it is without being etched.

Figure 3:
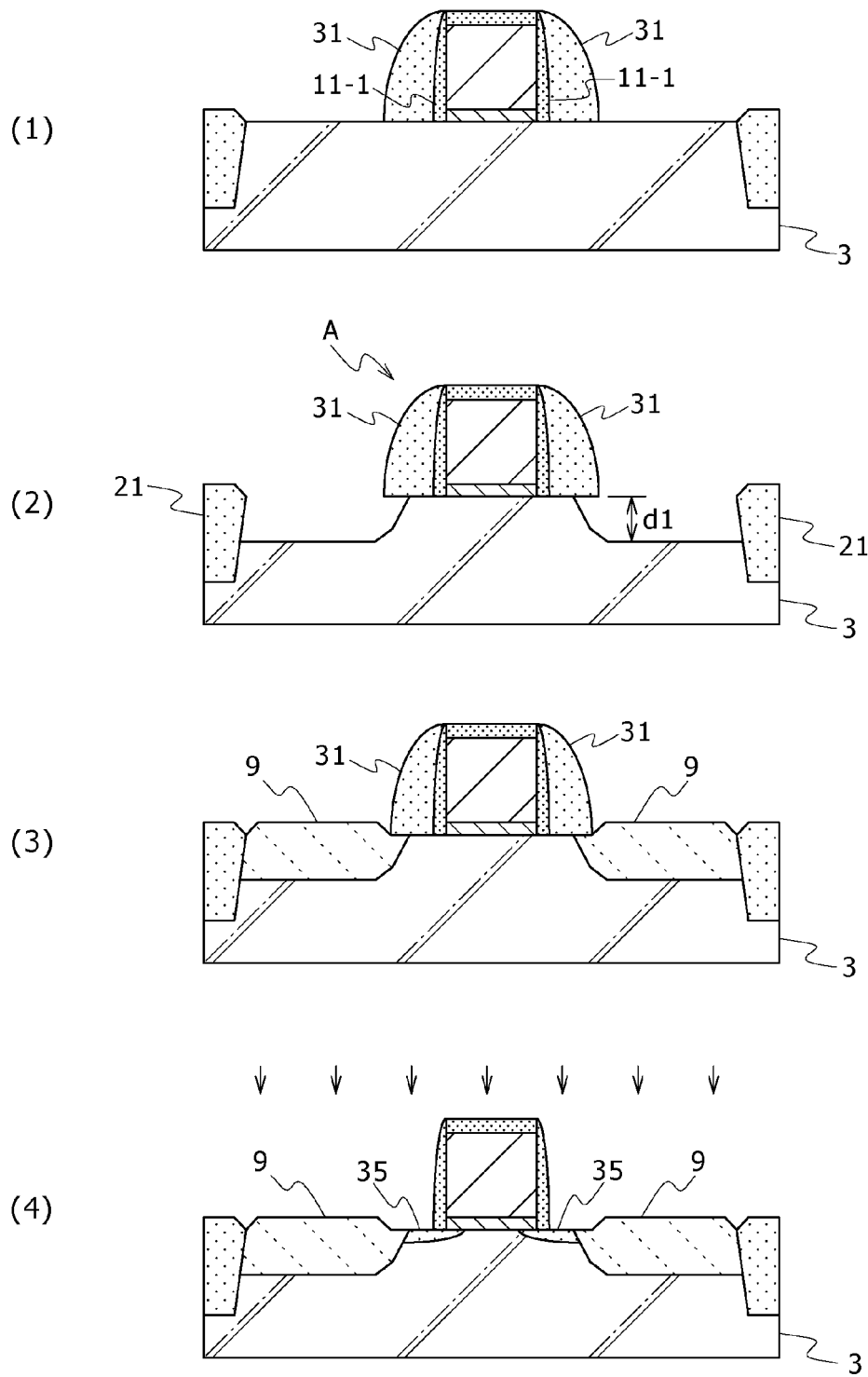
FIG. 3 is a sectional process view (2) of the first example of the manufacturing method according to the embodiment.

Next, as shown in (2) of FIG. 3, recess etching is performed in which the surface of the semiconductor substrate 3 is dug down by dry etching with the dummy gate structure A, the sacrifice side walls 31, and the device isolation 21 as a mask. In this case, it is supposed that the surface of the semiconductor substrate 3 is dug down (recessed) to a depth d1=about 50 to 100 nm. In addition, the semiconductor substrate 3 is thereby dug down with a space in proportion to the sacrifice side walls 31 being provided directly below the dummy gate structure A.

Thereafter, as shown in (3) of FIG. 3, semiconductor layers 9 having a different lattice constant from that of the semiconductor substrate 3 are formed as a stress applying layer by epitaxial growth on the exposed surface of the dug-down semiconductor substrate 3. In this case, the semiconductor layers 9 are created differently for the pMOS region and the nMOS region.

In the case of the pMOS region, the semiconductor layers 9 of SiGe having a larger lattice constant than the single-crystal silicon forming the semiconductor substrate 3 are epitaxially grown so as to be able to apply a compressive stress to the semiconductor substrate 3. In addition, to prevent a defect at an interface between the semiconductor substrate 3 and the semiconductor layers 9, the concentration of Ge is set in a range of about 15% to 40%. Further, a p-type impurity such as boron (B) or the like may be introduced into the semiconductor layers 9 in a concentration range of $5\times10^{18}$ to $5\times10^{20}/cm^3$ at the same time as the epitaxial growth. Thereby the whole of the semiconductor layers 9 functions as a source region and a drain region.

On the other hand, in the case of the nMOS region, the semiconductor layers 9 of SiC having a smaller lattice constant than the single-crystal silicon forming the semiconductor substrate 3 are formed by epitaxial growth so as to be able to apply a tensile stress to the semiconductor substrate 3. In addition, to prevent a defect at an interface between the semiconductor substrate 3 and the semiconductor layers 9, the concentration of C is set in a range of about 0.5% to 4%. Further, an n-type impurity such as phosphorus (P), arsenic (As) or the like may be introduced into the semiconductor layers 9 in a concentration range of $5\times10^{18}$ to $5\times10^{20}/cm^3$ at the same time as the epitaxial growth. Thereby the whole of the semiconductor layers 9 functions as a source region and a drain region.

After the semiconductor layers 9 are thus formed, the sacrifice side walls 31 formed of the silicon oxide film are removed by wet etching using a hydrofluoric acid.

Next, as shown in (4) of FIG. 3, an impurity for forming extensions 35 of the source region and the drain region is introduced into the surface layer of the semiconductor substrate 3 and the semiconductor layers 9 by ion implantation. At this time, a p-type impurity such as B, In is introduced into the pMOS region, and an n-type impurity such as As, P is introduced into the nMOS region. In addition, it is supposed that the ion implantation is performed with an implantation energy of about 0.5 to 2 keV and a dose amount of about $5\times10^{14}$ to $2\times10^{15}/cm^2$.

Figure 4:
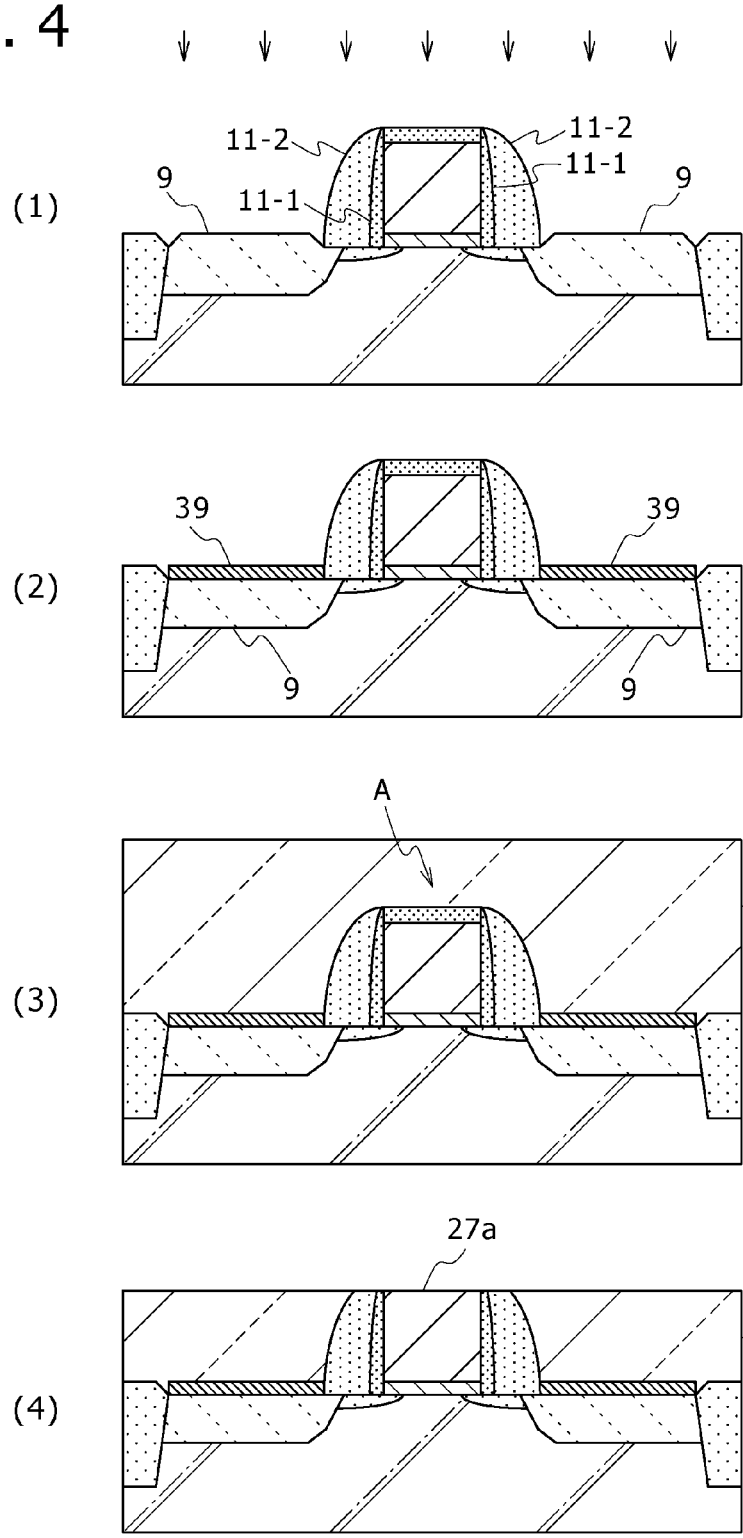
FIG. 4 is a sectional process view (3) of the first example of the manufacturing method according to the embodiment.

Next, as shown in (1) of FIG. 4, insulative second side walls 11-2 are formed on the outside of the first side walls 11-1. In this case, the second side walls 11-2 are formed by the formation of a silicon nitride film by a CVD method and the subsequent etching back of the silicon nitride film. Thereafter the ion implantation of an impurity such as P, As, B is performed to reduce resistance at a time of silicide formation to be performed next. Incidentally, when no impurity has been introduced at the time of the epitaxial growth of the semiconductor layers 9, an impurity for forming a source region and a drain region is implanted as required. After the impurity implantation, heat treatment at 900° C. to 1100° C. is performed in a range of 60 seconds or less in order to activate the implanted impurity.

Then, as shown in (2) of FIG. 4, cobalt (Co), nickel (Ni), platinum (Pt), or a silicide layer 39 thereof is formed by salicide process technology on the surface of the semiconductor layers 9 forming the source and the drain to reduce contact resistance of the source and the drain.

Next, as shown in (3) of FIG. 4, an interlayer insulating film 13 of a silicon oxide, for example, is formed in a state of burying the dummy gate structure A.

Next, as shown in (4) of FIG. 4, the surface of the interlayer insulating film 13 is polished by a CMP method until the dummy gate electrode 27a in the dummy gate structure A is exposed.

Figure 5:
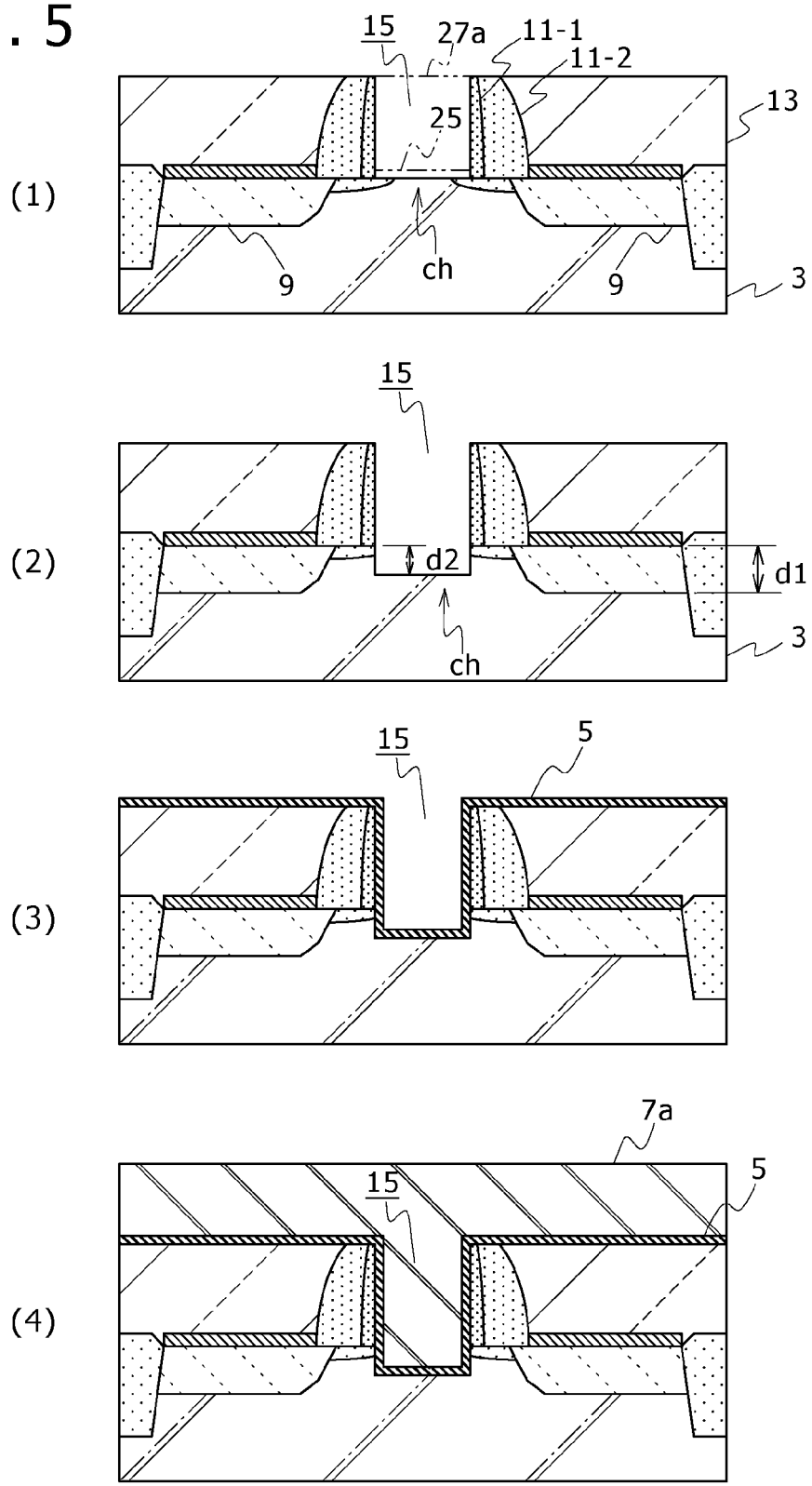
FIG. 5 is a sectional process view (4) of the first example of the manufacturing method according to the embodiment.

Next, as shown in (1) of FIG. 5, the dummy gate electrode 27a of polysilicon or amorphous silicon is removed by dry etching, and thereafter the dummy gate insulating film 25 of silicon oxide is removed by wet etching. Thereby, a groove pattern 15 obtained by removing the dummy gate structure A is formed in the interlayer insulating film 13 covering the semiconductor substrate 3 and the semiconductor layers 9, and the semiconductor substrate 3 is exposed at the bottom surface of the groove pattern 15. The side walls of the groove pattern 15 are defined by the side walls 11-1 and 11-2.

Next, as shown in (2) of FIG. 5, recess etching is performed which digs down the exposed surface of the semiconductor substrate 3 at the bottom part of the groove pattern 15. In this case, when the depth of the recess parts in which the semiconductor layers 9 are disposed with respect to the surface of the semiconductor substrate 3 is set as the depth d1 of the semiconductor layers 9, a channel depth d2 of the recess part in this case is [Channel Depth d2]<[Depth d1 of Semiconductor Layers 9]. Incidentally, it is supposed that the optimum value of the channel depth d2 in this range is determined empirically so as to maximize the stress applied to the channel part of a MOS transistor (field-effect transistor) formed in this case, as will be described later in detail.

Applied to such recess etching is a method in which a silicon oxide film having a film thickness of about 1 to 2 nm is formed on the surface of the semiconductor substrate 3 of single-crystal silicon by a plasma oxidation, in which oxidation is performed in a plasma atmosphere, and thereafter the silicon oxide film is removed by wet etching using a hydrofluoric acid. It is supposed that the plasma oxidation and the wet etching are performed repeatedly a necessary number of times according to the channel depth d2. This prevents damage from being inflicted on the exposed surface of the semiconductor substrate 3 which surface is exposed by the recess etching. In addition, it is desirable to perform the plasma oxidation at this time at 500° C. or lower in order to prevent re-diffusion due to the heat of the impurity.

Incidentally, in addition to the above-described plasma oxidation, oxidation using ozone or oxidation using a gas may be performed as the oxidation of the surface of the semiconductor substrate 3. There is another method of directly etching the silicon surface by a dry etching method.

Thus, the groove pattern 15 is dug down at a position separated between the semiconductor layers 9. Further, as can be appreciated from (2) of FIG. 5, the exposed surface of the semiconductor substrate 3 at the bottom part of the groove pattern 15 is dug down below the extensions 35 of the source region and the drain region.

Next, as shown in (3) of FIG. 5, a gate insulating film 5 is formed in a state of covering the inner walls of the groove pattern 15 formed by digging down the surface of the semiconductor substrate 3. In this case, it is desirable to form the gate insulating film 5 of a high dielectric constant material as described above by a CVD method, an ALD method or the like.

Next, as shown in (4) of FIG. 5, a gate electrode material film 7a is formed via the gate insulating film 5 in a state of filling the inside of the groove pattern 15. In this case, a metallic layer for a metal gate is formed as the gate electrode material film 7a by a CVD method, a PVD method, or an ALD method. It is supposed that the gate electrode material film 7a may be a single-layer structure or a laminated structure, and is formed using the materials described in the configuration of the device.

Next, as shown in (1) of FIG. 6, the gate electrode material film 7a and the gate insulating film 5 are polished by CMP until the interlayer insulating film 13 is exposed. Thereby a gate electrode 7 is formed by leaving the gate electrode material film 7a via the gate insulating film 5 within the groove pattern 15.

Thereafter, as required, as shown in (2) of FIG. 6, an upper layer insulating film 41 of a silicon oxide is formed in a state of covering the interlayer insulating film 13 and the gate electrode 7. Next, connecting holes 43 reaching the silicide layer 39 are formed in the upper layer insulating film 41 and the interlayer insulating film 13. Plugs filling these connecting holes 43 and wiring 45 connected thereto are then formed.

Thus, as described with reference to FIG. 1, a semiconductor device 1 is obtained in which the semiconductor layers 9 for applying a stress are provided in the recess parts formed by digging down the surface of the semiconductor substrate 3 on both sides of the gate electrode 7, and the gate insulating film 5 and the gate electrode 7 are provided further in a state of filling the recess part formed by digging down the surface of the semiconductor substrate 3.

Then, according to the above-described first example of the manufacturing method, by removing the dummy gate structure A with the semiconductor layers 9 formed as described with reference to (1) of FIG. 5, the stress applied from the semiconductor layers 9 to a part of the semiconductor substrate 3 under the dummy structure A is prevented from being weakened by reaction from the dummy gate electrode 27a. Thus, the stress from the semiconductor layers 9 is effectively applied to the channel part ch as the semiconductor substrate 3 between the semiconductor layers 9.

Then, in particular, as described with reference to the next (2) of FIG. 5, by further digging down the semiconductor substrate 3 at the bottom part of the groove pattern 15 obtained by removing the dummy gate structure A, the channel part ch is at a position deeper than the surface of the semiconductor substrate 3 between the semiconductor layers 9. Thereby the stress applied to the part of the semiconductor substrate 3 between the semiconductor layers 9 over the depth direction of the semiconductor layers 9 is intensively applied to the channel part ch. It is therefore possible to fabricate the semiconductor device 1 having the constitution capable of applying the stress from the semiconductor layers 9 to the channel part effectively and intensively.

As a result, it is possible to fabricate the semiconductor device 1 having the constitution capable of improving carrier mobility without depending on the concentration of the material forming the semiconductor layers 9.

Description will next be made of the optimum value of [Channel Depth d2] in the range where [Channel Depth d2]< [Depth d1 of Semiconductor Layers 9] as described with reference to FIG. 1. In this case, simulation was performed assuming the semiconductor device 1 in which the semiconductor layers 9 of SiGe are epitaxially grown so as to apply a compressive stress to the semiconductor substrate 3 made of single-crystal silicon. Then, the magnitude [Stress (Pa)] of the stress applied to a depth of 1 nm from the surface at the center of the channel part with respect to the channel depth d2 was calculated.

Figure 7:
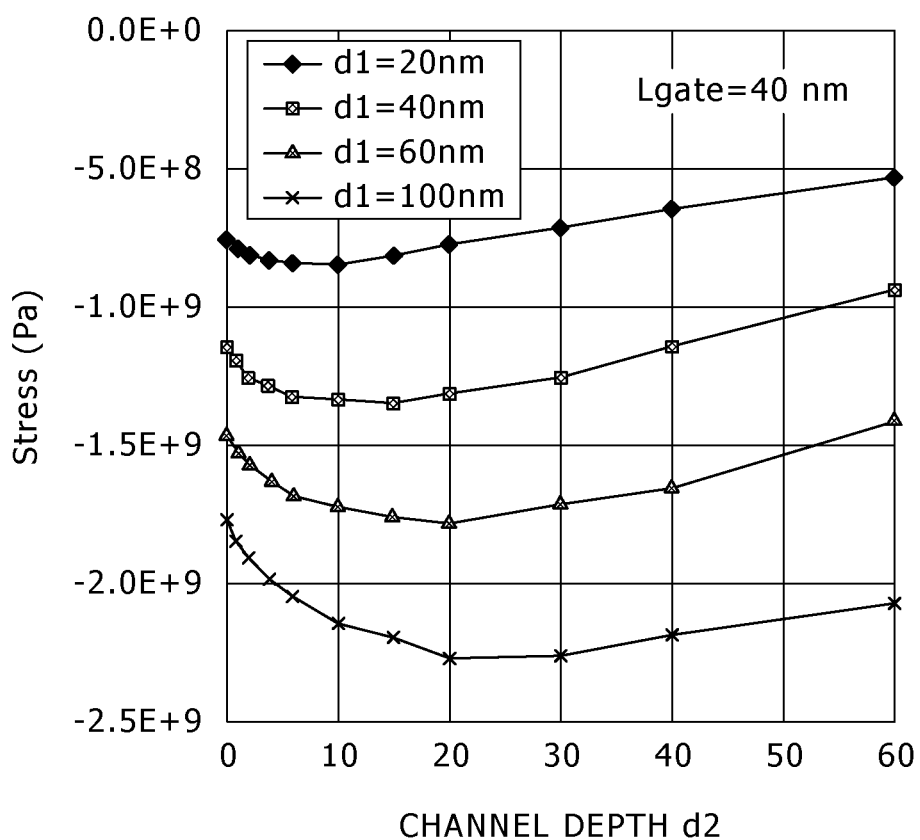
FIG. 7 is a graph showing the magnitude of a stress on a channel part with respect to a recess quantity d2 of a semiconductor substrate for each of depths of semiconductor layers.

FIG. 7 shows a result of simulation of a constitution in which [Width LGate of Groove Pattern 15] is fixed at 40 nm and [Concentration of Ge in Semiconductor Layers 9] is fixed at 20%, and [Depth d1 of Semiconductor Layers 9] is set to each of values of 20 nm, 40 nm, 60 nm, and 100 nm. This result confirms that in the range where [Channel Depth d2]< [Depth d1 of Semiconductor Layers 9], the stress applied to the channel part is higher than in a constitution in which [Channel Depth d2]=0. In addition, because [Channel Depth d2] at which the stress is highest differs depending on [Depth d1 of Semiconductor Layers 9], it is desirable to set the optimum value of [Channel Depth d2] according to [Depth d1 of Semiconductor Layers 9].

Figure 8:
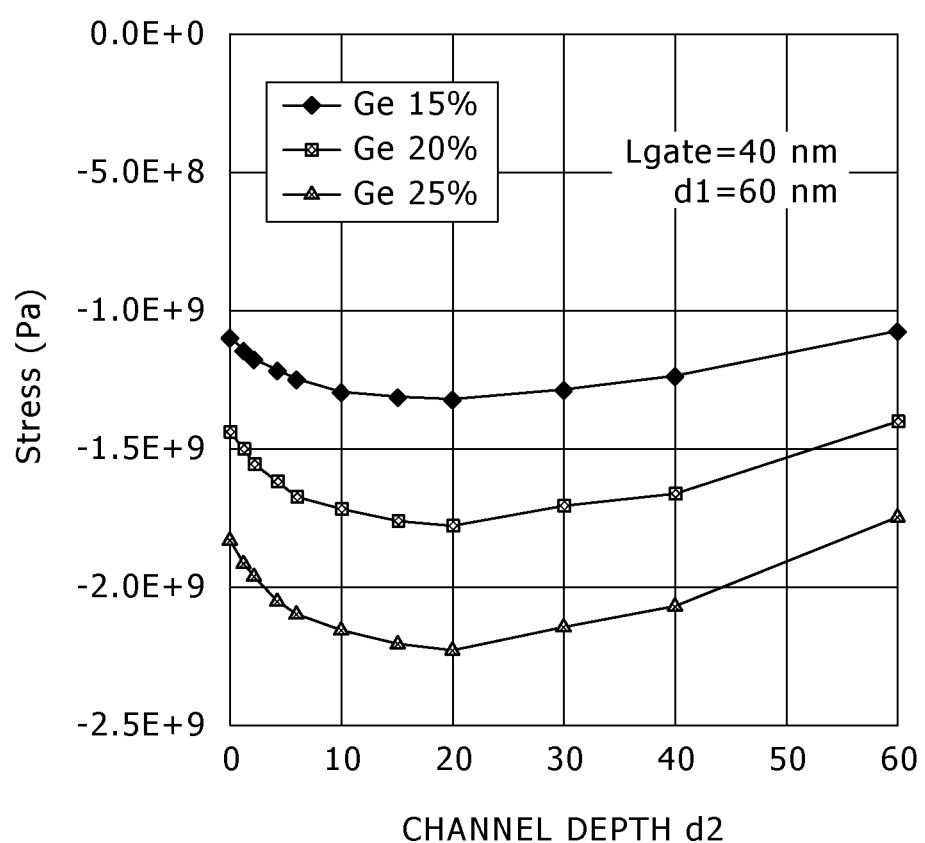
FIG. 8 is a graph showing the magnitude of the stress on the channel part with respect to the recess quantity d2 of the semiconductor substrate for each of Ge concentrations of the semiconductor layers.

FIG. 8 shows a result of simulation of a constitution in which [Width LGate of Groove Pattern 15] is fixed at 40 nm and [Depth d1 of Semiconductor Layers 9] is fixed at 60 nm, and [Concentration of Ge in Semiconductor Layers 9] is set to each of values of 15%, 20%, and 25%. This result confirms that [Channel Depth d2] at which the stress is highest does not vary depending on the material constitution (composition) of the semiconductor layers 9 when [Width LGate of Groove Pattern 15] and [Depth d1 of Semiconductor Layers 9] are fixed.

Figure 9:
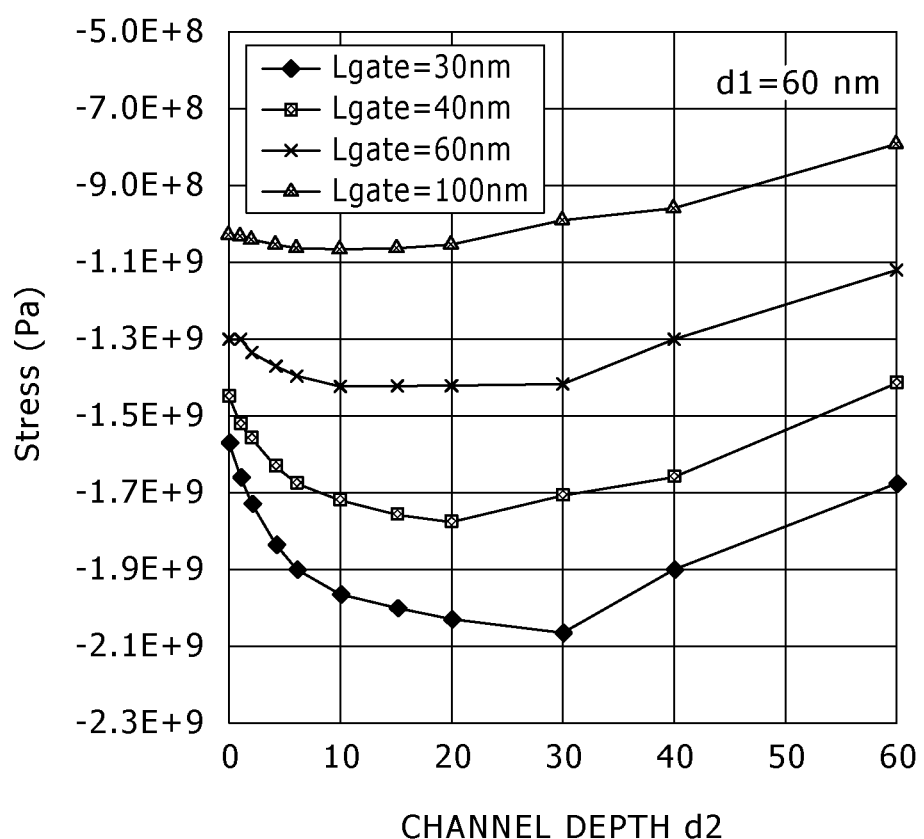
FIG. 9 is a graph showing the magnitude of the stress on the channel part with respect to the recess quantity d2 of the semiconductor substrate for each of widths of a groove pattern.

FIG. 9 shows a result of simulation of a constitution in which [Depth d1 of Semiconductor Layers 9] is fixed at 60 nm and [Concentration of Ge in Semiconductor Layers 9] is fixed at 20%, and [Width LGate of Groove Pattern 15] is set to each of values of 30 nm, 40 nm, 60 nm, and 100 nm. This result confirms that in the constitutions advanced in miniaturization with [Width LGate of Groove Pattern 15]=30 nm and 40 nm, in the range where [Channel Depth d2]<[Depth d1 of Semiconductor Layers 9], the stress applied to the channel part is higher than in the constitution in which [Channel Depth d2]=0. And because [Channel Depth d2] at which the stress is highest differs depending on [Width LGate of Groove Pattern 15], it is desirable to set the optimum value of [Channel Depth d2] according to [Width LGate of Groove Pattern 15].

<Method of Manufacturing Semiconductor Device—2>

FIGS. 10 to 13 are sectional process views of a second example of a semiconductor device manufacturing method to which the present invention is applied, and are another example of a method of manufacturing the semiconductor device having the constitution described with reference to FIG. 1. An embodiment of the manufacturing method will be described in the following with reference to these figures. Incidentally, description will be made with the same constituent elements as described with reference to the foregoing drawings being identified by the same reference numerals.

First, as shown in 10(1), a device isolation 21 is formed on the surface side of a semiconductor substrate 3. Further, a protective film not shown in this case is formed. The ion implantation of an impurity for threshold adjustment is performed through the protective film. The protective film is removed after the ion implantation. The process up to this step is performed in the same manner as in the first example.

Next, as shown in (2) of FIG. 10, a groove-shaped recess part 3a made to coincide with a part for forming a gate electrode to be formed later is formed in a space isolated by the device isolations 21 in the semiconductor substrate 3. This recess part 3a is formed by the recess etching of the semiconductor substrate 3 with a resist pattern formed by applying optical lithography technology or electron beam lithography technology as a mask. Incidentally, in this case, the surface layer of the recess part 3a becomes a channel part, and therefore the depth of the recess part 3a is the channel depth d2 described in the first example. As in the first example, this channel depth d2 is set such that [Channel Depth d2]<[Depth d1 of Semiconductor Layers], where d1 is the depth of semiconductor layers in a stress applying region to be formed later.

Figure 10:
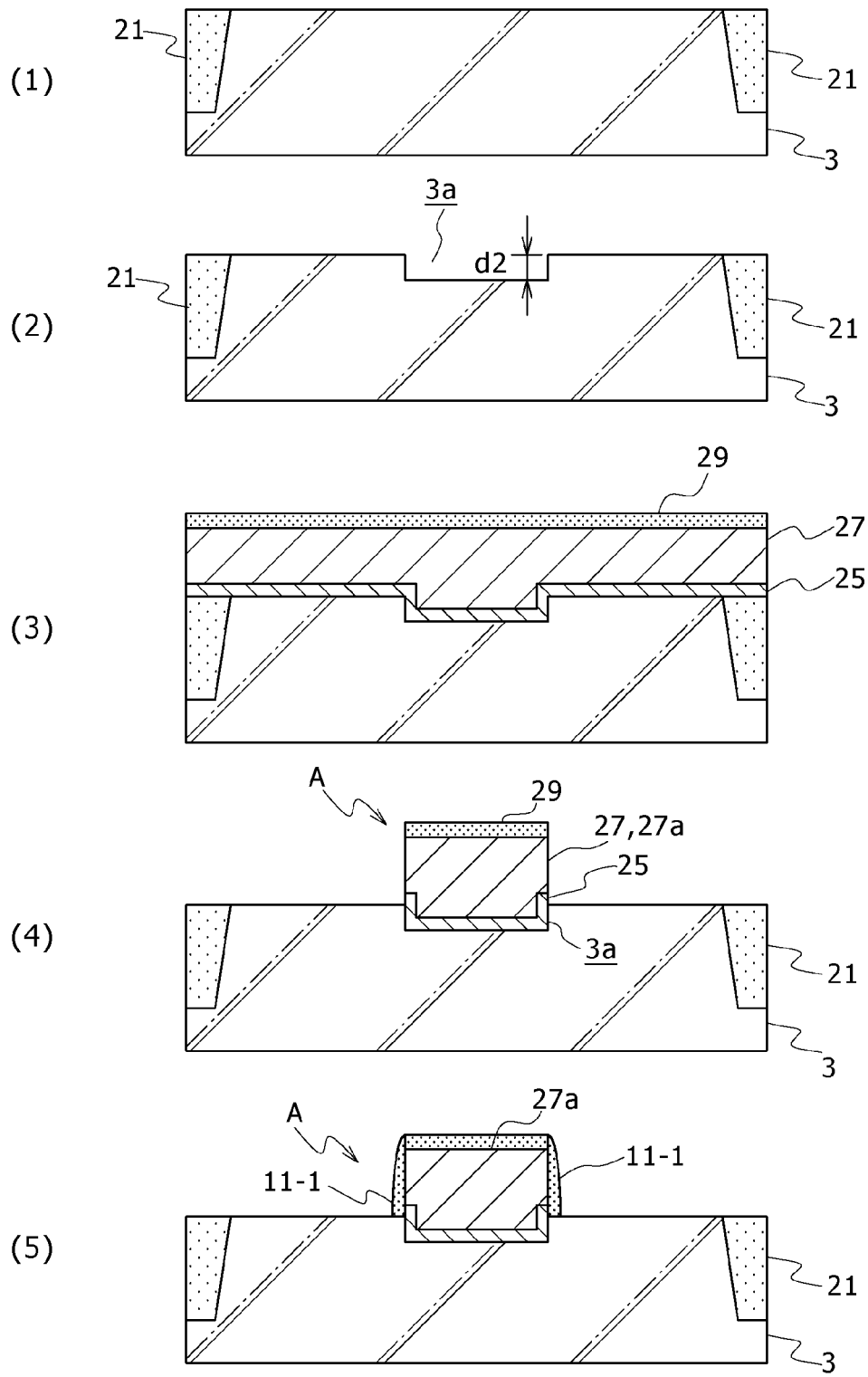
FIG. 10 is a sectional process view (1) of a second example of a manufacturing method according to an embodiment.

Thereafter, as shown in (3) of FIG. 10, as in the first example, a dummy gate insulating film 25 of a silicon oxide, a dummy gate electrode film 27 of polysilicon or amorphous silicon, and a hard mask layer 29 of a silicon nitride are further formed sequentially.

Next, as shown in (4) of FIG. 10, the hard mask layer 29, the dummy gate electrode film 27, and the dummy gate insulating film 25 are pattern-etched into the shape of a gate electrode, whereby a dummy gate structure A is formed so as to overlap the recess part 3a. Such pattern etching may be performed as in the first example. For example, etching using a resist pattern as a mask is performed. At this time, it is desirable to prevent etching damage from causing the surface of the semiconductor substrate 3 on both sides of the dummy gate structure A by performing the etching with the dummy gate insulating film 25 as a stopper.

Incidentally, in the example shown in the figure, a state in which the dummy gate structure A coincides with the recess part 3a is shown. However, it is acceptable for the dummy gate structure A as far as the dummy gate structure A is provided so as to overlap the recess part 3a, and these patterns may be misaligned.

Figure 12:
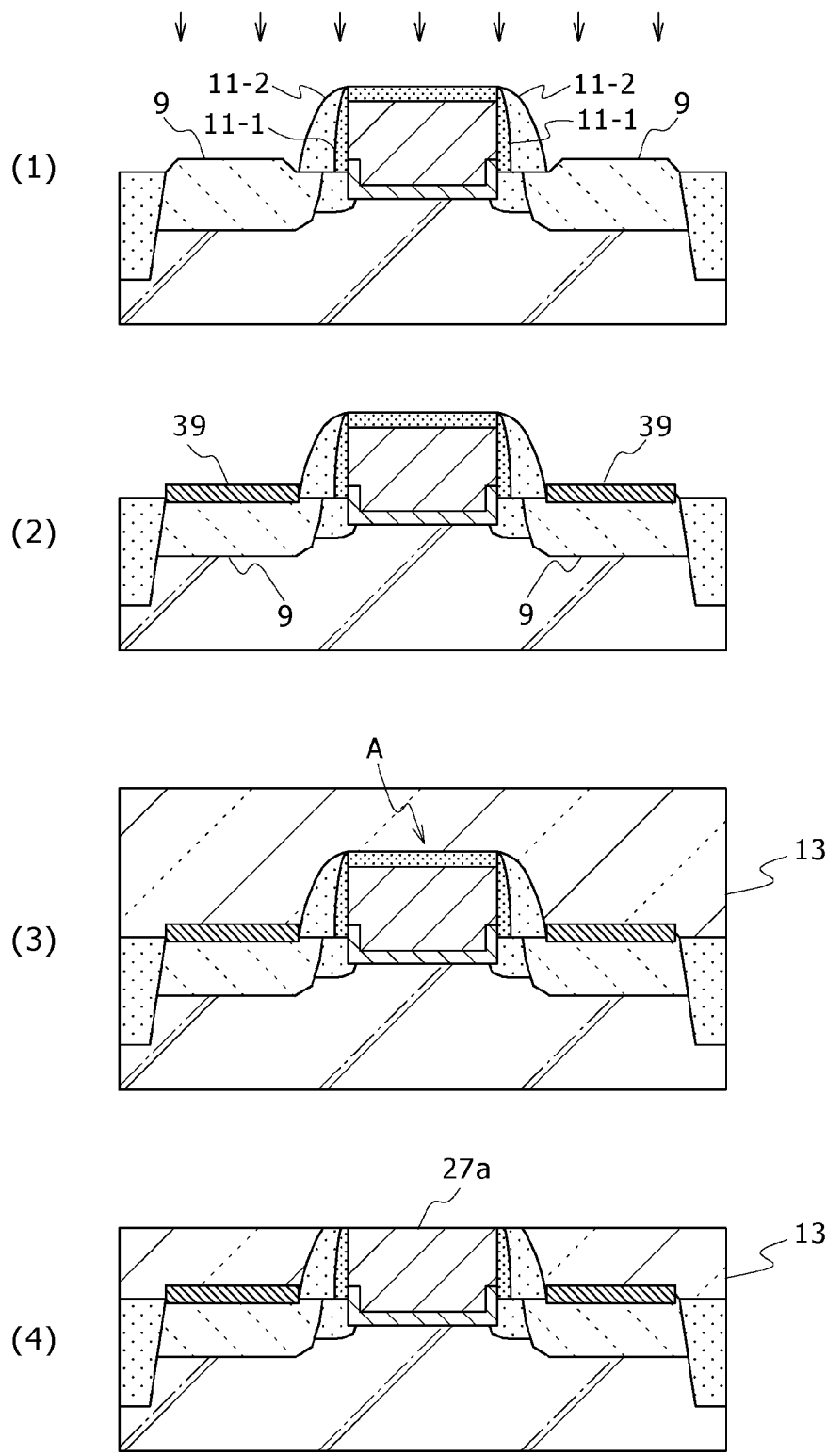
FIG. 12 is a sectional process view (3) of the second example of the manufacturing method according to the embodiment.

A process shown from (5) of FIG. 10 to (4) of FIG. 12 after the above may be performed in the same manner as in the first example.

Namely, as shown in (5) of FIG. 10, insulative first side walls 11-1 are formed on the side walls of the dummy gate structure A. The first side walls 11-1 are provided for extension position adjustment in formation of extensions of a source region and a drain region which formation is to be performed later. It therefore suffices to provide the first side walls 11-1 as required. Thus, it suffices to perform this process as required.

Next, as shown in (1) of FIG. 11, sacrifice side walls 31 of a silicon oxide to be removed later are formed on the outside of the first side walls 11-1 as in the first example. Incidentally, when the patterns of the dummy gate structure A and the recess part 3a are misaligned and the bottom surface of the recess part 3a is exposed from the dummy gate structure A at this point in time, it is desirable that the exposed part of the recess part 3a be completely covered by the sacrifice side walls 31.

Figure 11:
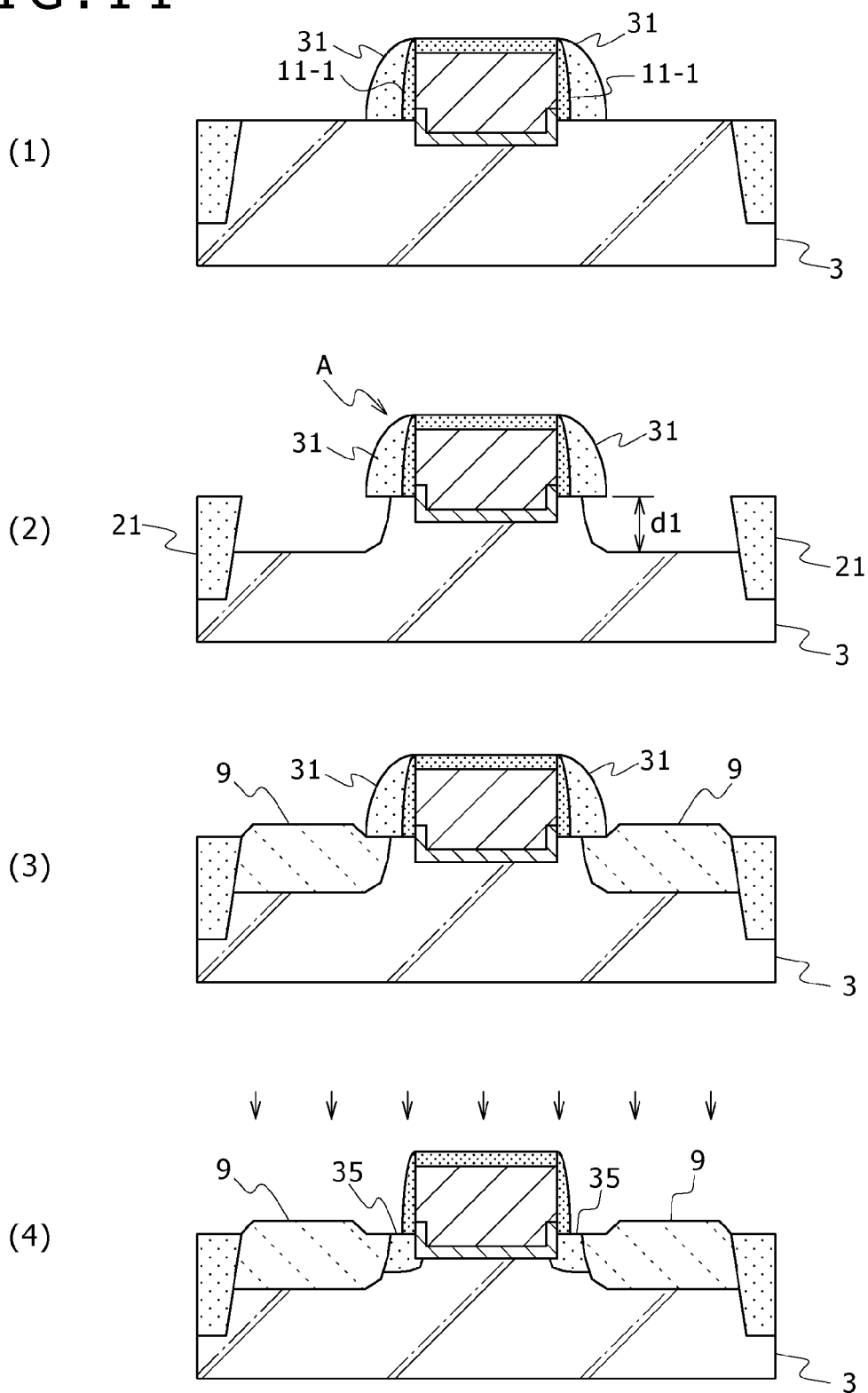
FIG. 11 is a sectional process view (2) of the second example of the manufacturing method according to the embodiment.

Next, as shown in (2) of FIG. 11, recess etching is performed in which the surface of the semiconductor substrate 3 is dug down by dry etching with the dummy gate structure A, the sacrifice side walls 31, and the device isolation 21 as a mask. In this case, because the depth of the recess part 3a formed previously is the channel depth d2 described in the first example, it is supposed that the surface of the semiconductor substrate 3 is dug down (recessed) to a depth d1=about 50 to 100 nm so that [Channel Depth d2]<[Depth d1 of Semiconductor Layers] as in the foregoing first example. In addition, as in the first example, the semiconductor substrate 3 is thereby dug down with a space in proportion to the sacrifice side walls 31 being provided directly below the dummy gate structure A.

Thereafter, as shown in (3) of FIG. 11, semiconductor layers 9 having a different lattice constant from that of the semiconductor substrate 3 are formed as a stress applying layer by epitaxial growth on the exposed surface of the dug-down semiconductor substrate 3. In this case, the semiconductor layers 9 are created differently for the pMOS region and the nMOS region. In addition, as in the first example, after the semiconductor layers 9 are thus formed, the sacrifice side walls 31 formed of the silicon oxide film are removed by wet etching using a hydrofluoric acid.

Next, as shown in (4) of FIG. 11, an impurity for forming extensions 35 of the source region and the drain region is introduced into the surface layer of the semiconductor substrate 3 and the semiconductor layers 9 by ion implantation. At this time, as in the first example, different impurities are introduced into the pMOS region and the nMOS region by performing different ion implantations.

Next, as shown in (1) of FIG. 12, insulative second side walls 11-2 are formed on the outside of the first side walls 11-1. Thereafter impurity ion implantation is performed to reduce resistance at a time of silicide formation to be performed next. At this time, when no impurity has been introduced at the time of the epitaxial growth of the semiconductor layers 9, as in the first example, an impurity for forming the source region and the drain region is implanted as required. Further, as in the first example, heat treatment is performed to activate the impurity. Incidentally, when the patterns of the dummy gate structure A and the recess part 3a are misaligned and the bottom surface of the recess part 3a is exposed from the dummy gate structure A, it is desirable that the exposed part of the recess part 3a be completely covered by the second side walls 11-2.

Thereafter, as shown in (2) of FIG. 12, a silicide layer 39 is formed by salicide process technology on the surface of the semiconductor layers 9 forming the source and the drain. Further, as shown in (3) of FIG. 12, an interlayer insulating film 13 of a silicon oxide, for example, is formed in a state of burying the dummy gate structure A. Thereafter, as shown in (4) of FIG. 12, the surface of the interlayer insulating film 13 is polished by a CMP method until a dummy gate electrode 27a in the dummy gate structure A is exposed. The above is performed in the same manner as in the first example.

Figure 13:
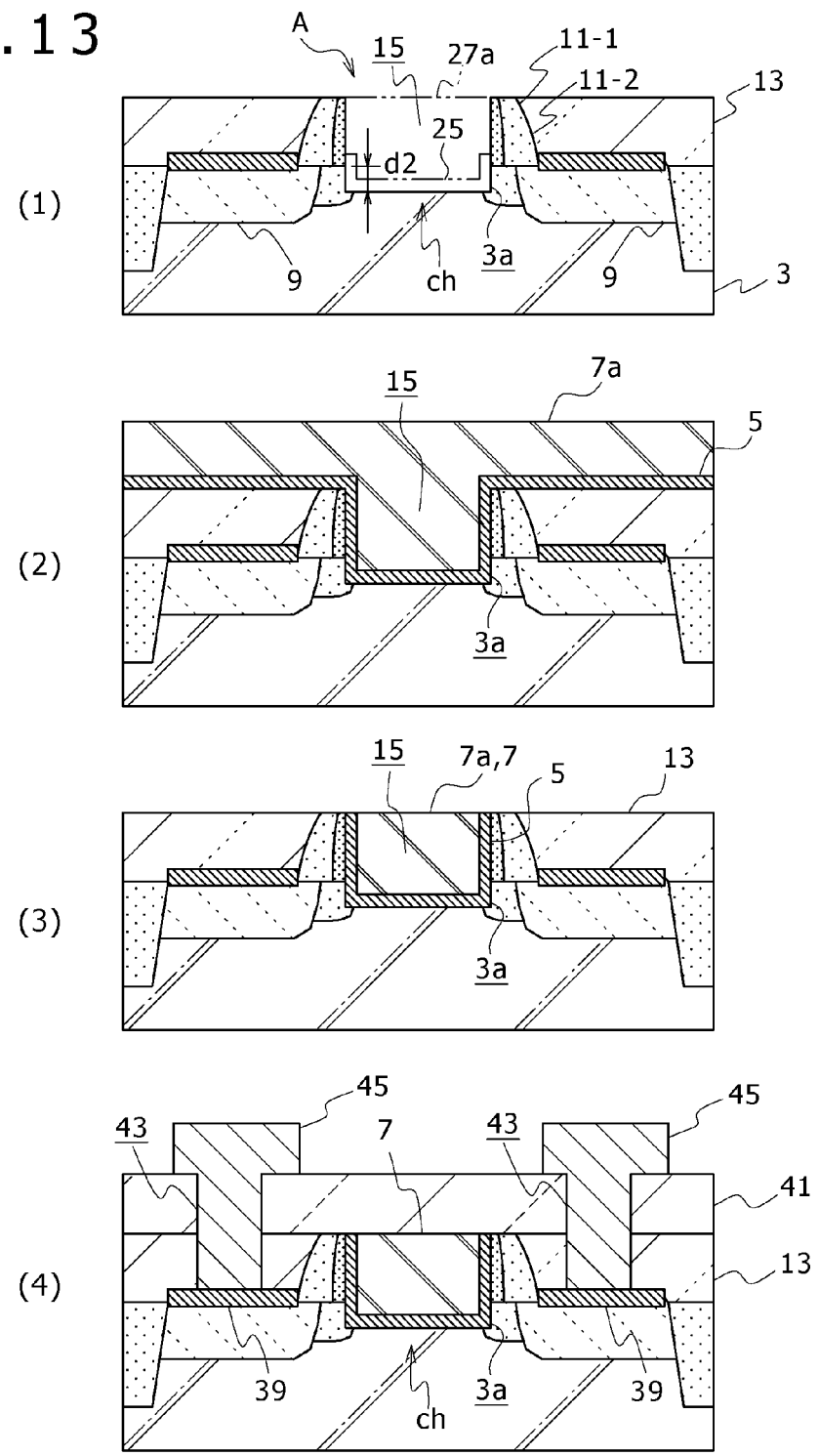
FIG. 13 is a sectional process view (4) of the second example of the manufacturing method according to the embodiment.

Next, as shown in (1) of FIG. 13, the dummy gate electrode 27a of polysilicon or amorphous silicon is removed by dry etching, and thereafter the dummy gate insulating film 25 of silicon oxide is removed by wet etching. Thereby, a groove pattern 15 obtained by removing the dummy gate structure A is formed in the interlayer insulating film 13 covering the semiconductor substrate 3 and the semiconductor layers 9, and the semiconductor substrate 3 is exposed at the bottom surface of the groove pattern 15. This groove pattern 15 is formed so as to overlap the recess part 3a. Thus, the bottom part of the groove pattern 15 is formed by the recess part 3a obtained by digging down the semiconductor substrate 3 to the channel depth d2. In addition, as in the first example, the side walls of the groove pattern 15 are defined by the side walls 11-1 and 11-2.

Thereafter, as shown in (2) of FIG. 13, a gate insulating film 5 of a high dielectric constant material as described above is formed by a CVD method, an ALD method or the like in a state of covering the inner walls of the groove pattern 15 including the recess part 3a formed by digging down the surface of the semiconductor substrate 3. Further, a gate electrode material film 7a similar to that of the first example is formed via the gate insulating film 5 in a state of filling the inside of the groove pattern 15.

Further, as shown in (3) of FIG. 13, the gate electrode material film 7a and the gate insulating film 5 are polished by CMP until the interlayer insulating film 13 is exposed. Thereby a gate electrode 7 is formed by leaving the gate electrode material film 7a via the gate insulating film 5 within the groove pattern 15.

Thereafter, as required, as shown in (4) of FIG. 13, an upper layer insulating film 41 of a silicon oxide is formed in a state of covering the interlayer insulating film 13 and the gate electrode 7. Next, connecting holes 43 reaching the silicide layer 39 are formed in the upper layer insulating film 41 and the interlayer insulating film 13. Plugs filling these connecting holes 43 and wiring 45 connected thereto are then formed.

Thus, as described with reference to FIG. 1, a semiconductor device 1 is obtained in which the semiconductor layers 9 for applying a stress are provided in the recess parts formed by digging down the surface of the semiconductor substrate 3 on both sides of the gate electrode 7, and the gate insulating film 5 and the gate electrode 7 are provided further in a state of filling the recess part (the recess part 3a) formed by digging down the surface of the semiconductor substrate 3.

Then, even with the above-described second example of the manufacturing method, by removing the dummy gate structure A with the semiconductor layers 9 formed as described with reference to (1) of FIG. 13, the stress applied from the semiconductor layers 9 to a part of the semiconductor substrate 3 under the dummy structure A is prevented from being weakened by reaction from the dummy gate electrode 27a. Thus, the stress from the semiconductor layers 9 is effectively applied to the channel part ch as the semiconductor substrate 3 between the semiconductor layers 9.

In addition, because the bottom surface of the recess part 3a formed by digging down the semiconductor substrate 3 becomes the channel part ch, the channel part ch is at a position deeper than the surface of the semiconductor substrate 3 between the semiconductor layers 9. As in the first example, the stress applied to the part of the semiconductor substrate 3 between the semiconductor layers 9 over the depth direction of the semiconductor layers 9 is intensively applied to the channel part ch. It is therefore possible to fabricate the semiconductor device 1 having the constitution capable of applying the stress from the semiconductor layers 9 to the channel part effectively and intensively.

As a result, as in the first example, it is possible to fabricate the semiconductor device 1 having the constitution capable of improving carrier mobility without depending on the concentration of the material forming the semiconductor layers 9.

<Method of Manufacturing Semiconductor Device—3>

Figure 14:
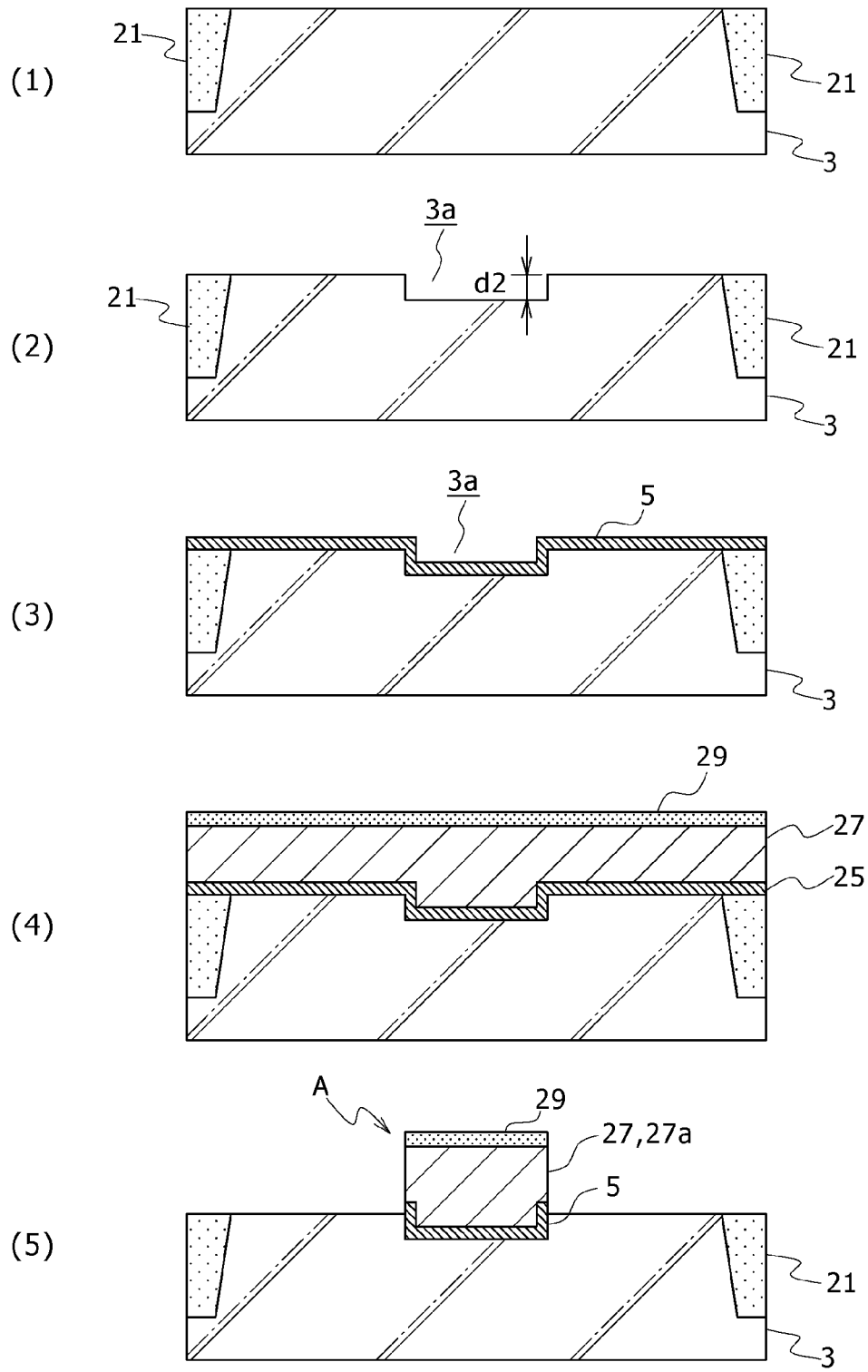
FIG. 14 is a sectional process view (1) of a third example of a manufacturing method according to an embodiment.
Figure 15:
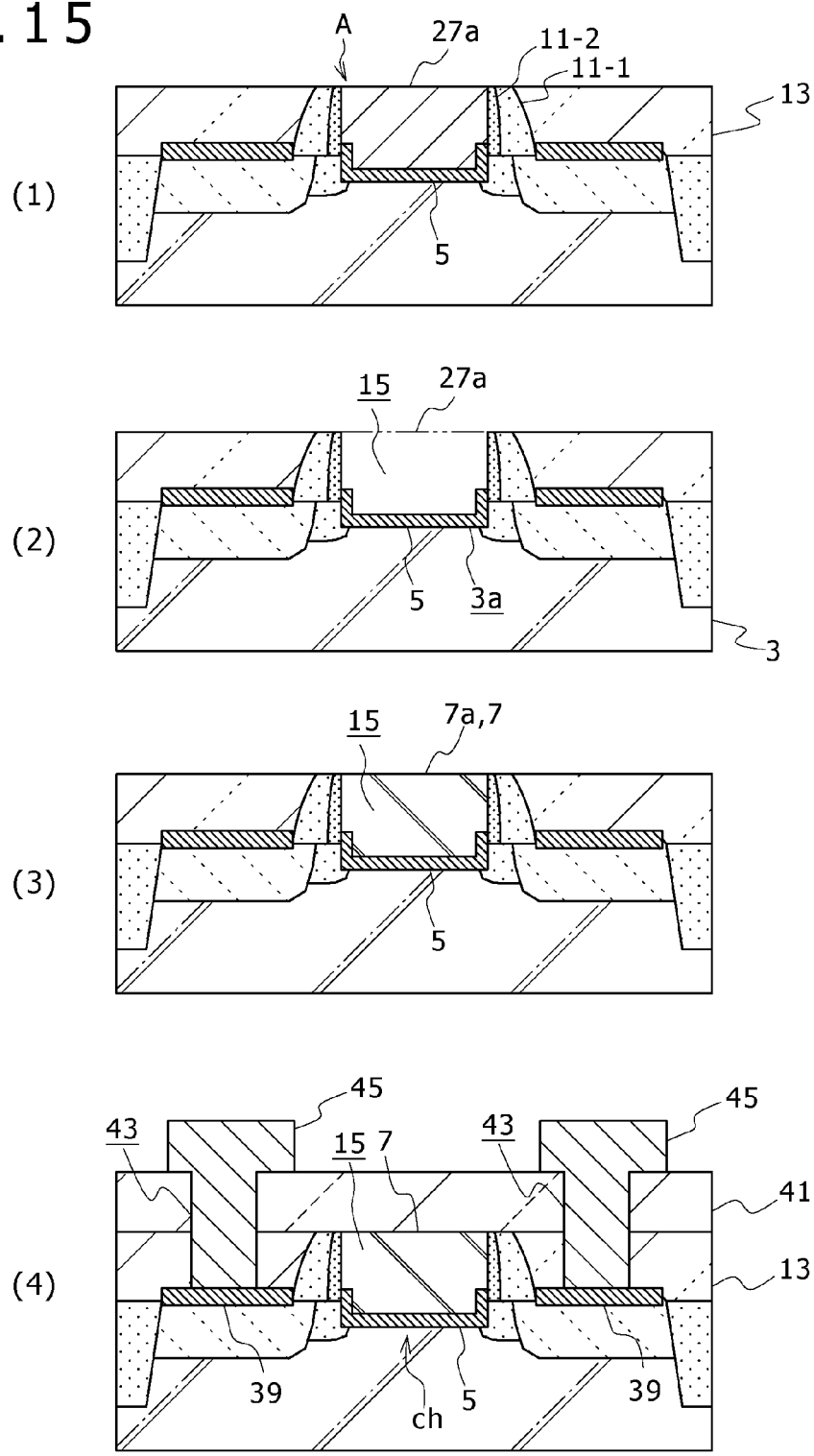
FIG. 15 is a sectional process view (2) of the third example of the manufacturing method according to the embodiment.

FIGS. 14 to 15 are sectional process views of principal parts of a third example of a semiconductor device manufacturing method to which the present invention is applied. An embodiment of the manufacturing method will be described in the following with reference to these figures. Incidentally, the third example of the manufacturing method represented in these figures is an example of modification of the second example described above. The same constituent elements as described with reference to the foregoing drawings are identified by the same reference numerals, and repeated description will be omitted.

First, as described in the foregoing second example, as shown in (1) of FIG. 14, a device isolation 21 is formed on the surface side of a semiconductor substrate 3. Further, as shown in (2) of FIG. 14, a groove-shaped recess part 3a made to coincide with a part for forming a gate electrode to be formed later is formed in a space isolated by the device isolations 21 in the semiconductor substrate 3. In this case, the recess part 3a becomes a channel part, and as in the first example and the second example, this channel depth d2 is set such that [Channel Depth d2]<[Depth d1 of Semiconductor Layers], where d1 is the depth of semiconductor layers in a stress applying region to be formed later.

Next, as shown in (3) of FIG. 14, a gate insulating film 5 of a high dielectric constant material as described above is formed by a CVD method, an ALD method or the like in a state of covering the inner walls of the recess part 3a formed by digging down the surface of the semiconductor substrate 3. The third example is different from the foregoing second example in that the gate insulating film 5 is thus formed in advance.

Thereafter, as shown in (4) of FIG. 14, a dummy gate electrode film 27 of polysilicon or amorphous silicon and a hard mask layer 29 of a silicon nitride are further formed sequentially on the gate insulating film 5.

Next, as shown in (5) of FIG. 14, the hard mask layer 29 is etched with a resist pattern not shown in this figure as a mask, whereby the hard mask layer 29 is patterned. The dummy gate electrode film 27 is then patterned into a dummy gate electrode 27a by etching from over the patterned hard mask layer 29. In the patterning of the dummy gate electrode film 27, etching damage is prevented from causing the surface of the semiconductor substrate 3 on both sides of a dummy gate structure A by performing the etching with the gate insulating film 5 made of a high dielectric constant material as a stopper. As such etching, dry etching using for example $HBr/O_2$ as an etching gas is performed.

In addition, the gate insulating film 5 is etched following the above dry etching, leaving the gate insulating film 5 only under the dummy gate structure A.

Incidentally, in the example shown in the figure, a state in which the dummy gate structure A coincides with the recess part 3a is shown. However, as in the second example, it suffices for the dummy gate structure A to be provided so as to overlap the recess part 3a, and these patterns may be misaligned.

After the above, the same process as described with reference to FIG. 11 and FIG. 12 in the second example is performed. Thereby, as shown in (1) of FIG. 15, the dummy gate electrode 27a is exposed from an interlayer insulating film 13 covering the dummy gate structure A and side walls 11-1 and 11-2 provided on both sides of the dummy gate structure A.

Next, as shown in (2) of FIG. 15, the dummy gate electrode 27a of polysilicon or amorphous silicon is removed by dry etching with the gate insulating film 5 remaining. Thereby, a groove pattern 15 obtained by removing the dummy gate structure A is formed in the interlayer insulating film 13 covering the semiconductor substrate 3 and semiconductor layers 9. While the bottom surface of the groove pattern 15 is covered with the gate insulating film 5, as in the second example, this groove pattern 15 is formed so as to overlap the recess part 3a. In addition, as in the first example and the second example, the side walls of the groove pattern 15 are defined by the side walls 11-1 and 11-2.

Thereafter, as shown in (3) of FIG. 15, the same gate electrode material film as in the first example is formed in a state of burying the inside of the groove pattern 15. Further, the gate electrode material film is polished by CMP. Thereby a gate electrode 7 is formed within the groove pattern 15.

Thereafter, as required, as shown in (4) of FIG. 15, an upper layer insulating film 41 of a silicon oxide is formed in a state of covering the interlayer insulating film 13 and the gate electrode 7. Next, connecting holes 43 reaching a silicide layer 39 are formed in the upper layer insulating film 41 and the interlayer insulating film 13. Plugs filling these connecting holes 43 and wiring 45 connected thereto are then formed.

Then, even with the above-described third example of the manufacturing method, by removing the dummy gate electrode 27a with the semiconductor layers 9 formed as described with reference to (2) of FIG. 15, the stress applied from the semiconductor layers 9 to a part of the semiconductor substrate 3 under the dummy gate electrode 27a is prevented from being weakened by reaction from the dummy gate electrode 27a. Thus, the stress from the semiconductor layers 9 is effectively applied to a channel part ch as the semiconductor substrate 3 between the semiconductor layers 9.

In addition, because the bottom surface of the recess part 3a formed by digging down the semiconductor substrate 3 becomes the channel part ch, the channel part ch is at a position deeper than the surface of the semiconductor substrate 3 between the semiconductor layers 9. As in the first example, the stress applied to the part of the semiconductor substrate 3 between the semiconductor layers 9 over the depth direction of the semiconductor layers 9 is intensively applied to the channel part ch. It is therefore possible to fabricate a semiconductor device 1 having the constitution capable of applying the stress from the semiconductor layers 9 to the channel part effectively and intensively.

In addition, in the fabrication procedure of the third example, the gate insulating film 5 is not formed on an upper part of the side walls of the groove pattern 15 including the recess part 3a. That is, it is constituted that the gate insulating film 5 is disposed in a state of exposing an upper part of the inner walls of the groove pattern 15. Thus, the gate insulating film 5 formed of a high dielectric constant material does not exist between the gate electrode 7 and the wiring 45, so that an effect of being able to prevent a degradation in device performance due to a parasitic capacitance between the gate electrode 7 and the wiring 45 can be obtained.

<Method of Manufacturing Semiconductor Device—4>

Figure 16:
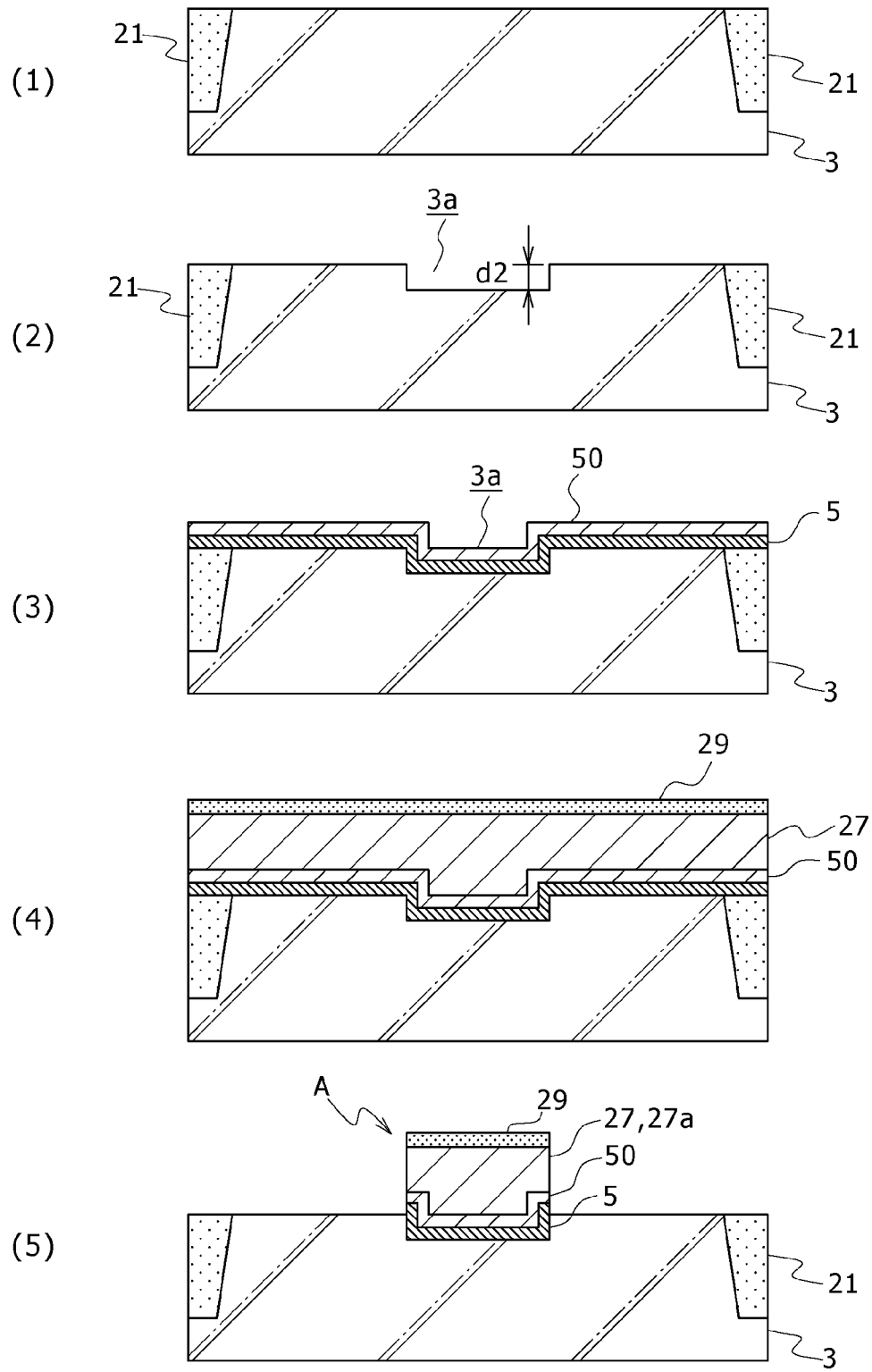
FIG. 16 is a sectional process view (1) of a fourth example of a manufacturing method according to an embodiment.
Figure 17:
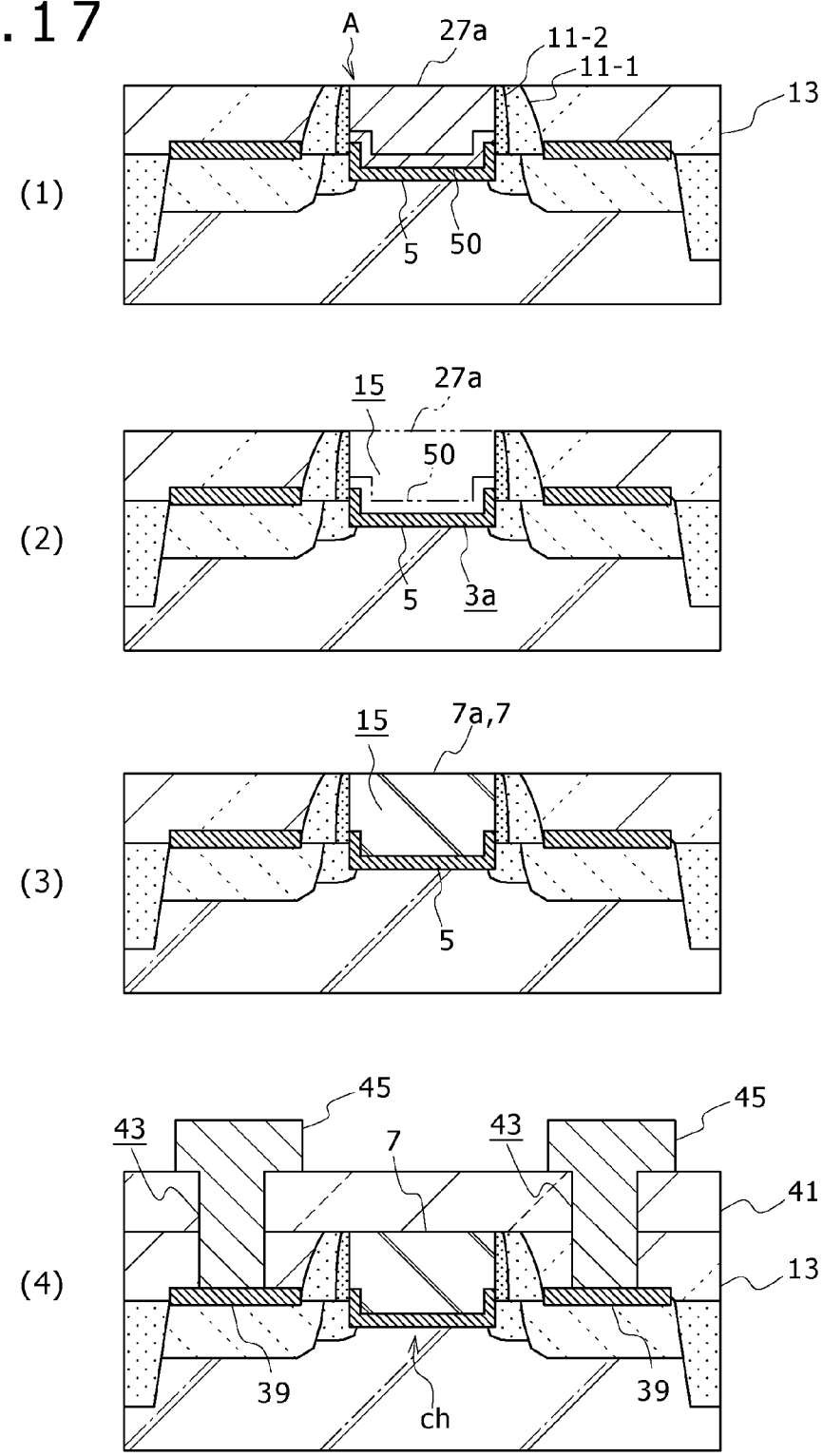
FIG. 17 is a sectional process view (2) of the fourth example of the manufacturing method according to the embodiment.

FIGS. 16 to 17 are sectional process views of a fourth example of a semiconductor device manufacturing method to which the present invention is applied. An embodiment of the manufacturing method will be described in the following with reference to these figures. Incidentally, the fourth example of the manufacturing method represented in these figures is an example of modification of the second example and the third example described above. The same constituent elements as described with reference to the foregoing drawings are identified by the same reference numerals, and repeated description will be omitted.

First, as described in the foregoing second example, as shown in (1) of FIG. 16, a device isolation 21 is formed on the surface side of a semiconductor substrate 3. Further, as shown in (2) of FIG. 16, a groove-shaped recess part 3a made to coincide with a part for forming a gate electrode to be formed later is formed in a space isolated by the device isolations 21 in the semiconductor substrate 3. In this case, the recess part 3a becomes a channel part, and as in the first example and the second example, this channel depth d2 is set such that [Channel Depth d2]<[Depth d1 of Semiconductor Layers], where d1 is the depth of semiconductor layers in a stress applying region to be formed later.

Next, as shown in (3) of FIG. 16, a gate insulating film 5 of a high dielectric constant material as described above is formed by a CVD method, an ALD method or the like in a state of covering the inner walls of the recess part 3a formed by digging down the surface of the semiconductor substrate 3. Then, a cap film 50 is further formed on the gate insulating film 5 by a CVD method, a PVD method, an ALD method or the like. The cap film 50 is to protect the gate insulating film 5 in a subsequent process. A titanium nitride (TiN) film, for example, is formed at a film thickness of about 1 to 10 nm as such the cap film 50.

Thereafter, as shown in (4) of FIG. 16, a dummy gate electrode film 27 of polysilicon or amorphous silicon and a hard mask layer 29 of a silicon nitride are further formed sequentially on the cap film 50.

Next, as shown in (5) of FIG. 16, the hard mask layer 29 is etched with a resist pattern not shown in this figure as a mask, whereby the hard mask layer 29 is patterned. The dummy gate electrode film 27 is then patterned into a dummy gate electrode 27a by etching from over the patterned hard mask layer 29. In addition, following the etching of the dummy gate electrode film 27, the cap film 50 is etched, and then the gate insulating film 5 is etched. Thereby, the gate insulating film 5 is left only under a dummy gate structure A.

Incidentally, as in the foregoing third example, in the patterning of the dummy gate electrode film 27, etching damage is prevented from causing the surface of the semiconductor substrate 3 on both sides of the dummy gate structure A by performing the etching with the cap film 50 and the gate insulating film 5 made of a high dielectric constant material as a stopper. In addition, in the example shown in the figure, a state in which the dummy gate structure A coincides with the recess part 3a is shown. However, as in the second example and the third example, it suffices for the dummy gate structure A to be provided so as to overlap the recess part 3a, and these patterns may be misaligned.

After the above, the process described with reference to FIG. 11 and FIG. 12 is performed as in the second example and the third example. Thereby, as shown in (1) of FIG. 17, the dummy gate electrode 27a is exposed from an interlayer insulating film 13 covering the dummy gate structure A and side walls 11-1 and 11-2 provided on both sides of the dummy gate structure A.

Next, as shown in (2) of FIG. 17, the dummy gate electrode 27a of polysilicon or amorphous silicon is removed by dry etching. At this time, the cap film 50 is used as an etching stopper to thereby prevent damage from causing the gate insulating film 5 made of a high dielectric constant material.

Thereafter, the cap film 50 is selectively removed by wet etching or dry etching that causes little etching damage to the foundation.

Thereby, a groove pattern 15 obtained by removing the dummy gate structure A is formed in the interlayer insulating film 13 covering the semiconductor substrate 3 and semiconductor layers 9. While the bottom surface of the groove pattern 15 is covered with the gate insulating film 5, this groove pattern 15 is formed so as to overlap the recess part 3a. In addition, as in the foregoing first to third examples, the side walls of the groove pattern 15 are defined by the side walls 11-1 and 11-2.

Thereafter, as shown in (3) of FIG. 17, the same gate electrode material film as in the first example is formed in a state of burying the inside of the groove pattern 15. Further, a gate electrode material film 7a is polished by CMP. Thereby a gate electrode 7 is formed by leaving the gate electrode material film 7a via the gate insulating film 5 within the groove pattern 15.

Thereafter, as required, as shown in (4) of FIG. 17, an upper layer insulating film 41 of a silicon oxide is formed in a state of covering the interlayer insulating film 13 and the gate electrode 7. Next, connecting holes 43 reaching a silicide layer 39 are formed in the upper layer insulating film 41 and the interlayer insulating film 13. Plugs filling these connecting holes 43 and wiring 45 connected thereto are then formed.

Then, even with the above-described fourth example of the manufacturing method, by removing the dummy gate electrode 27a with the semiconductor layers 9 formed as described with reference to (2) of FIG. 17, the stress applied from the semiconductor layers 9 to a part of the semiconductor substrate 3 under the dummy gate electrode 27a is prevented from being weakened by reaction from the dummy gate electrode 27a. Thus, the stress from the semiconductor layers 9 is effectively applied to a channel part ch as the semiconductor substrate 3 between the semiconductor layers 9.

In addition, because the bottom surface of the recess part 3a formed by digging down the semiconductor substrate 3 becomes the channel part ch, the channel part ch is at a position deeper than the surface of the semiconductor substrate 3 between the semiconductor layers 9. As in the first example, the stress applied to the part of the semiconductor substrate 3 between the semiconductor layers 9 over the depth direction of the semiconductor layers 9 is intensively applied to the channel part ch. It is therefore possible to fabricate a semiconductor device 1 having the constitution capable of applying the stress from the semiconductor layers 9 to the channel part effectively and intensively.

In addition, in the fabrication procedure of the fourth example, the gate insulating film 5 is not formed on an upper part of the side walls of the groove pattern 15 including the recess part 3a. For this reason, as in the third example, the gate insulating film 5 formed of a high dielectric constant material does not exist between the gate electrode 7 and the wiring 45, so that an effect of being able to prevent a degradation in device performance due to a parasitic capacitance between the gate electrode 7 and the wiring 45 can be obtained.

Further, in the present fourth example, the cap film 50 is provided on the gate insulating film 5 to be used as an etching stopper at the time of removing the dummy gate electrode 27a. Thereby, even with the procedure in which the gate insulating film 5 is formed in advance, it is possible to prevent etching damage at the time of removing the dummy gate electrode 27a from being inflicted on the gate insulating film 5, and to maintain the film quality of the gate insulating film 5.

Incidentally, while it is constituted that the cap film 50 is removed in the fourth example described above, the cap film 50 may be left as it is as a part of the gate electrode. In this case, the cap film 50 may be left as a work function controlling layer described in the structure of the device, and it suffices to select a material properly and use the material.

<Method of Manufacturing Semiconductor Device—5>

Figure 18:
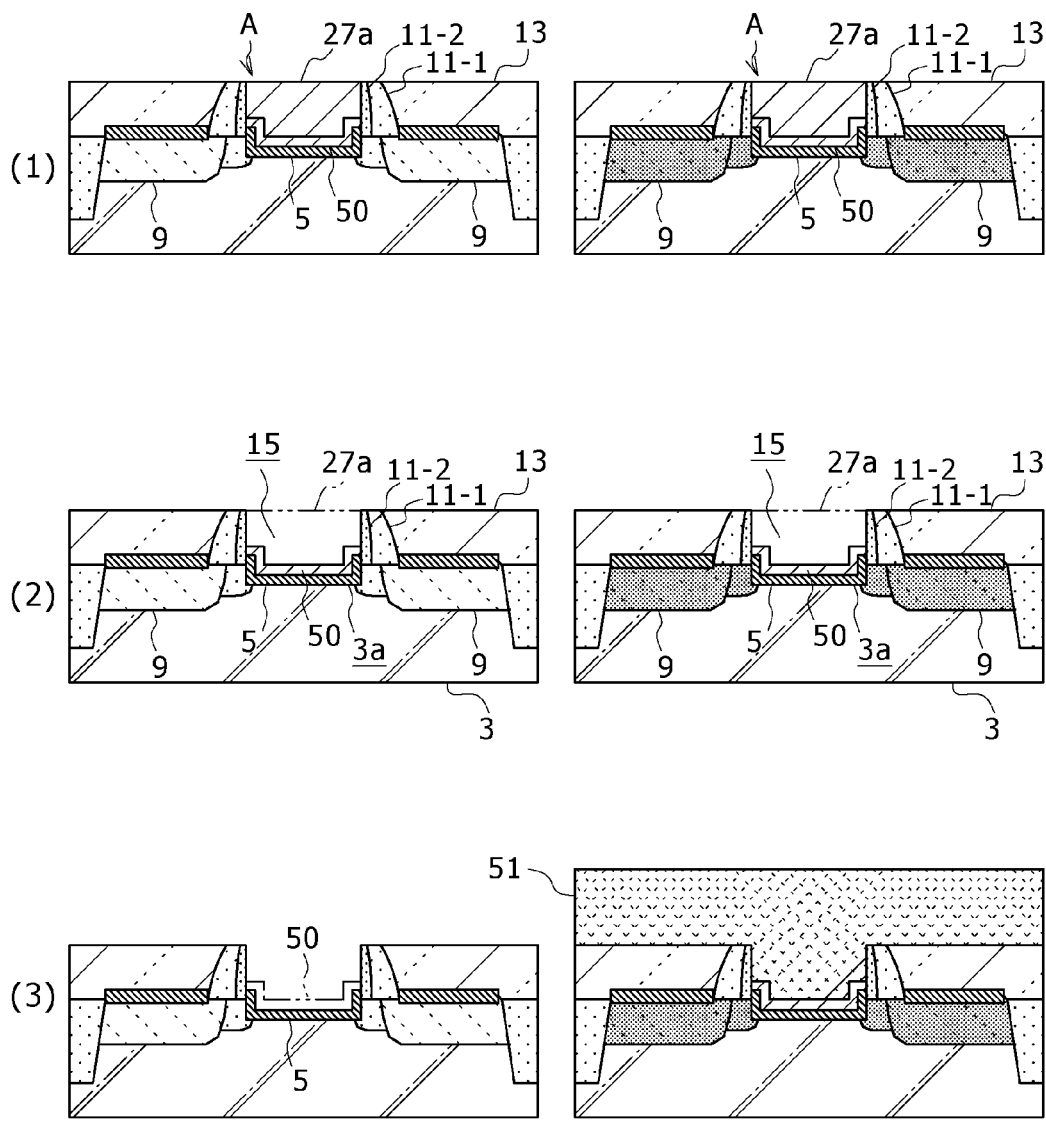
FIG. 18 is a sectional process view explaining an embodiment in which the present invention is applied to CMOS as a fifth example.
Figure 18:
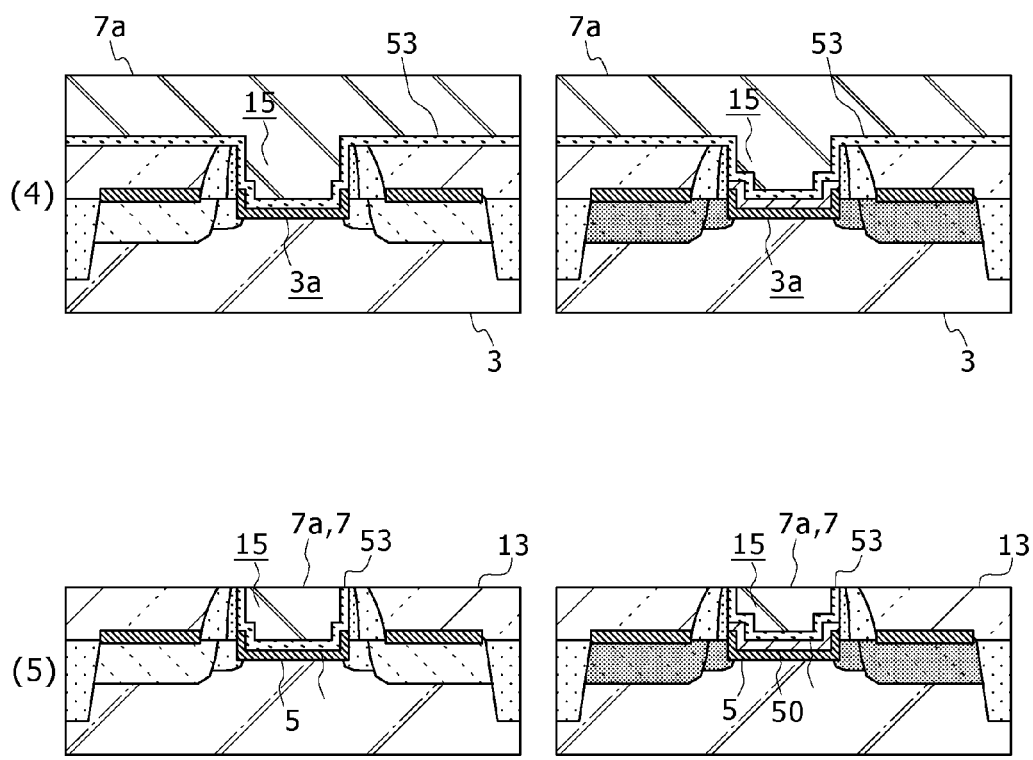

FIG. 18 is a diagram representing a procedure for fabricating a semiconductor device of a CMOS configuration to which the fourth example as described above is applied and in which the gate electrodes of a p-type field-effect transistor and an n-type field-effect transistor are formed differently. A fifth example of a semiconductor device manufacturing method to which the present invention is applied will be described below with reference to the diagram. Incidentally, it is supposed that a right side on the drawing is a pMOS region in which the p-type field-effect transistor is provided, and that a left side is an nMOS region in which the n-type field-effect transistor is provided.

In this case, by the same procedure as in the fourth example, as shown in (1) of FIG. 18, a dummy gate 27a is provided on a gate insulating film 5 via a cap film 50. The dummy gate electrode 27a is exposed from an interlayer insulating film 13 covering the dummy gate structure A and side walls 11-1 and 11-2 provided on both sides of the dummy gate structure A. At this time, in the nMOS region, semiconductor layers 9 functioning as a source region and a drain region are formed as an n-type. On the other hand, in the pMOS region, semiconductor layers 9 functioning as a source region and a drain region are a p-type. In addition, a material for forming a work function controlling layer of a gate electrode in a p-type field-effect transistor, for example, is used as a material forming the cap film 50.

Next, as shown in (2) of FIG. 18, in the nMOS region and the pMOS region, the dummy gate electrode 27a made of polysilicon or amorphous silicon is removed by dry etching. At this time, the cap film 50 is used as an etching stopper to thereby prevent damage from causing the gate insulating film 5 made of a high dielectric constant material.

Thereby, a groove pattern 15 obtained by removing the dummy gate structure A is formed in the interlayer insulating film 13 covering a semiconductor substrate 3 and the semiconductor layers 9. While the bottom surface of the groove pattern 15 is covered with the gate insulating film 5, this groove pattern 15 is formed so as to overlap a recess part 3a. In addition, as in the foregoing examples, the side walls of the groove pattern 15 are defined by the side walls 11-1 and 11-2.

Thereafter, as shown in (3) of FIG. 18, with the pMOS region covered with a resist mask 51, only the cap film 50 of the nMOS region is selectively removed by wet etching or dry etching that causes little etching damage to the foundation. The resist mask 51 is removed after this etching.

Thereafter, as shown in (4) of FIG. 18, a work function controlling layer 53 is formed in a state of covering the inner walls of the groove pattern 15 including the recess part 3a formed by digging down the surface of the semiconductor substrate 3. Further, a gate electrode material film 7a is formed in a state of filling the inside of the groove pattern 15. It is supposed that a material for forming a work function controlling layer of a gate electrode in an n-type field-effect transistor is used as a material forming the work function controlling layer 53.

Next, as shown in (5) of FIG. 18, the gate electrode material film 7a and the work function controlling layer 53 are polished by CMP until the interlayer insulating film 13 is exposed. Thereby, in the nMOS region, an n-type field-effect transistor is obtained which has a gate electrode 7 formed by leaving the work function controlling layer 53 and the gate electrode material film 7a via the gate insulating film 5 within the groove pattern 15. On the other hand, in the pMOS region, a p-type field-effect transistor is obtained which has a gate electrode 7 formed by leaving the cap film 50, the work function controlling layer 53, and even the gate electrode material film 7a via the gate insulating film 5 within the groove pattern 15.

Incidentally, it suffices to adjust the work function of each gate electrode 7 as appropriate by leaving each of the cap film 50 and the work function controlling layer 53 in both or only one of the nMOS region and the pMOS region as required.

<Method of Manufacturing Semiconductor Device—6>

Figure 19:
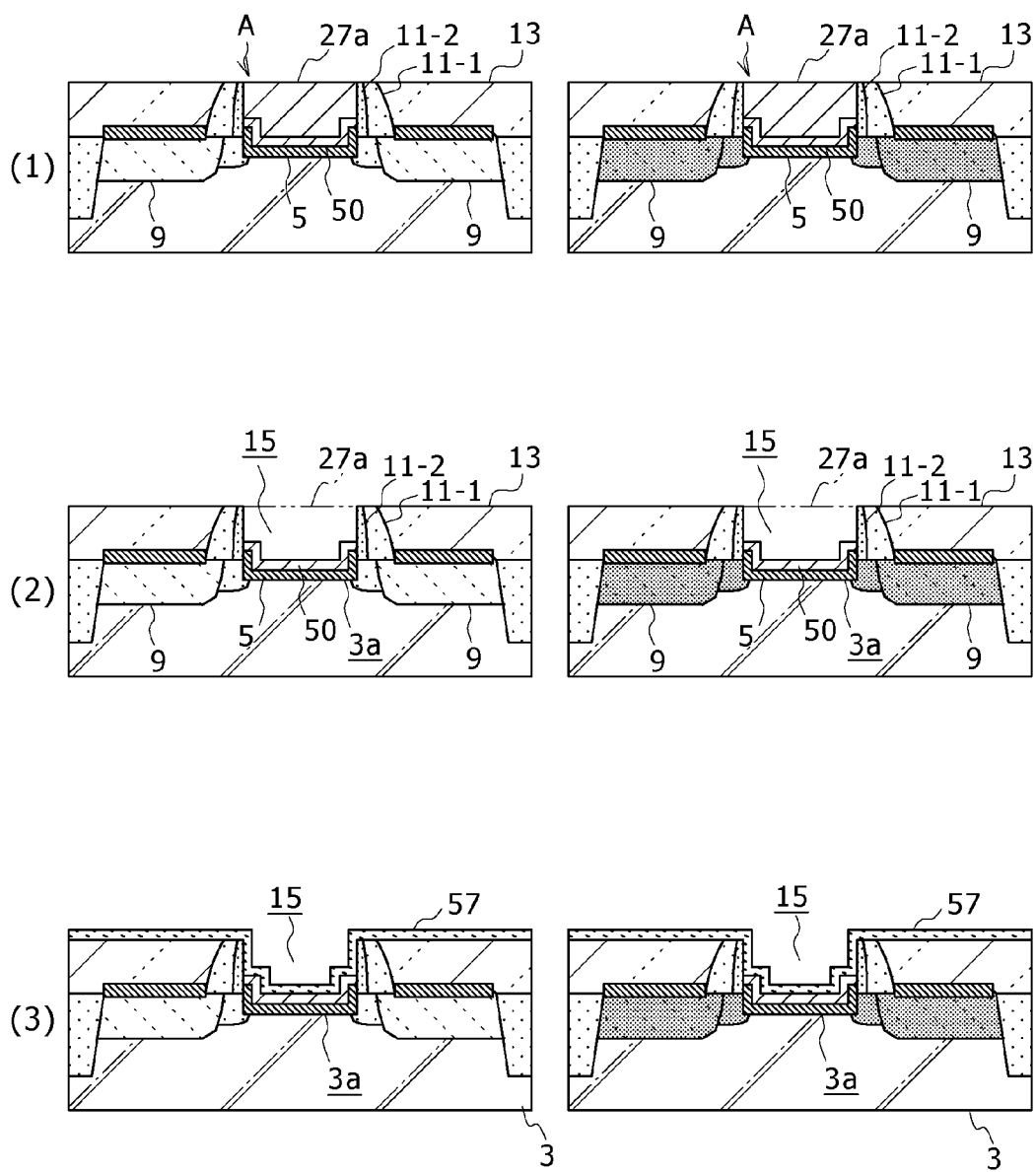
FIG. 19 is a sectional process view explaining an embodiment in which the present invention is applied to CMOS as a sixth example.

FIG. 19 is a diagram representing another procedure for fabricating a semiconductor device of a CMOS configuration to which the fourth example as described above is applied and in which the gate electrodes of a p-type field-effect transistor and an n-type field-effect transistor are formed differently. A sixth example of a semiconductor device manufacturing method to which the present invention is applied will be described below with reference to the diagram. Incidentally, it is supposed that a right side on the drawing is a pMOS region in which the p-type field-effect transistor is provided, and that a left side is an nMOS region in which the n-type field-effect transistor is provided.

In this case, by the same procedure as in the fourth example, as shown in (1) of FIG. 19, a dummy gate 27a is provided on a gate insulating film 5 via a cap film 50. The dummy gate electrode 27a is exposed from an interlayer insulating film 13 covering a dummy gate structure A and side walls 11-1 and 11-2 provided on both sides of the dummy gate structure A. At this time, in the nMOS region, semiconductor layers 9 functioning as a source region and a drain region are formed as an n-type. On the other hand, in the pMOS region, semiconductor layers 9 functioning as a source region and a drain region are a p-type. In addition, a material that reacts with a metallic layer to be described next to form a work function controlling layer of a gate electrode in an n-type field-effect transistor is used as a material forming the cap film 50. There is a difference from the cap film 50 in the fifth example in this respect.

Next, as shown in (2) of FIG. 19, in the n-type region and the p-type region, the dummy gate electrode 27a made of polysilicon or amorphous silicon is removed by dry etching. At this time, the cap film 50 is used as an etching stopper to thereby prevent damage from causing the gate insulating film 5 made of a high dielectric constant material.

Thereby, a groove pattern 15 obtained by removing the dummy gate structure A is formed in the interlayer insulating film 13 covering a semiconductor substrate 3 and the semiconductor layers 9. While the bottom surface of the groove pattern 15 is covered with the gate insulating film 5, this groove pattern 15 is formed so as to overlap a recess part 3a. In addition, as in the foregoing examples, the side walls of the groove pattern 15 are defined by the side walls 11-1 and 11-2.

Next, as shown in (3) of FIG. 19, a metallic layer 57 is formed in a state of covering the inner walls of the groove pattern 15 including the recess part 3a formed by digging down the surface of the semiconductor substrate 3. It is supposed that a material that reacts with the cap film 50 to thereby form a work function controlling layer of a gate electrode in an n-type field-effect transistor is used as a material forming the metallic layer 57. The metallic layer 57 of such is formed using for example Al, Ti, Cu, La or the like.

Thereafter, as shown in (4) of FIG. 19, with the nMOS region covered with a resist mask 55, only the metallic layer 57 of the pMOS region is selectively removed by wet etching or dry etching that causes little etching damage to the foundation. The resist mask 55 is removed after this etching.

Next, as shown in (5) of FIG. 19, the metallic layer 57 and the cap film 50 left in only the nMOS region are made to react with each other by performing heat treatment, so that a work function controlling layer 59 made from these reactants is formed.

Next, as shown in (6) of FIG. 19, a gate electrode material film 7a is formed in a state of covering the inner walls of the groove pattern 15 including the recess part 3a formed by digging down the surface of the semiconductor substrate 3. The gate electrode material film 7a and the metallic layer 57 are polished by CMP until the interlayer insulating film 13 is exposed. Thereby, in the nMOS region, an n-type field-effect transistor is obtained which has a gate electrode 7 formed by leaving the work function controlling layer 59 and the gate electrode material film 7a via the gate insulating film 5 within the groove pattern 15. On the other hand, in the pMOS region, a p-type field-effect transistor is obtained which has a gate electrode 7 formed by leaving the cap film 50 forming a work function controlling layer and the gate electrode material film 7a via the gate insulating film 5 within the groove pattern 15.

Incidentally, the work function controlling layer 59 formed by the reaction caused by the heat treatment may be formed in the pMOS region. In addition, the metallic layer 57 remaining unreacted within the groove pattern 15 may be removed.

What is claimed is:

1. A method of manufacturing a semiconductor device, said method comprising:
   a first step of forming a dummy gate electrode on a semiconductor substrate, and digging down a surface of said semiconductor substrate by etching with said dummy gate electrode as a mask, said semiconductor substrate being formed of single-crystal silicon;
   a second step of forming stress applying layers by epitaxial growth on the dug-down portion of said semiconductor substrate, said stress applying layers being of a semiconductor material having a different lattice constant from that of said semiconductor substrate and extending to a first position below a surface of said semiconductor substrate;
   a third step of forming extensions of a source region and a drain region;
   a fourth step of forming an interlayer insulating film in a state of covering said dummy gate electrode and said stress applying layers, making said dummy gate electrode exposed from said interlayer insulating film, and then removing said dummy gate electrode, whereby a groove pattern is formed in said interlayer insulating film, and said semiconductor substrate is exposed;
   a fifth step of digging down an exposed surface of said semiconductor substrate exposed at a bottom part of said groove pattern, the fifth step including digging down the exposed surface of said semiconductor substrate below the extensions of the source region and the drain region to a second position below the surface of said semiconductor substrate; and
   a sixth step of filling and forming a new gate electrode via a gate insulating film within said groove pattern in which the exposed surface of said semiconductor substrate is dug down to said second position below the surface of said semiconductor substrate, whereby a channel part under said new gate electrode is at said second position below the surface of said semiconductor substrate and said second position of said channel part with respect to the surface of said semiconductor substrate is shallower than said first position of said stress applying layers.

2. The method of claim 1, wherein:
in said first step, side walls are formed on side walls of said dummy gate electrode, and the surface of said semiconductor substrate is dug down by etching with said dummy gate electrode and said side walls as a mask, and
in said second step, said stress applying layers are formed on an outside of said side walls.

\* \* \* \* \*